(12) United States Patent
Iwata et al.

(10) Patent No.: US 7,592,189 B2
(45) Date of Patent: Sep. 22, 2009

(54) MRAM AND METHOD OF MANUFACTURING THE SAME

(75) Inventors: Yoshihisa Iwata, Yokohama (JP);
Yoshiaki Fukuzumi, Yokohama (JP);
Tadashi Kai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 11/935,923

(22) Filed: Nov. 6, 2007

(65) Prior Publication Data
US 2008/0261331 A1 Oct. 23, 2008

Related U.S. Application Data

(62) Division of application No. 10/933,247, filed on Sep. 3, 2004, now Pat. No. 7,326,982.

(30) Foreign Application Priority Data
Apr. 28, 2004 (JP) ............................. 2004-133445

(51) Int. Cl.
*H01L 21/00* (2006.01)
(52) U.S. Cl. .................................. 438/3; 257/E21.665
(58) Field of Classification Search ................ 438/3; 257/E21.665
See application file for complete search history.

(56) References Cited

U.S. PATENT DOCUMENTS

| | | | |
|---|---|---|---|
| 5,757,695 A | 5/1998 | Shi et al. |
| 5,841,692 A | 11/1998 | Gallagher et al. |
| 6,005,800 A | 12/1999 | Koch et al. |
| 6,021,065 A | 2/2000 | Daughton et al. |
| 6,097,625 A | 8/2000 | Scheuerlein |
| 6,104,633 A | 8/2000 | Abraham et al. |
| 6,114,719 A | 9/2000 | Dill et al. |
| 6,518,588 B1 | 2/2003 | Parkin et al. |
| 6,605,836 B2 | 8/2003 | Kishi et al. |
| 6,765,821 B2 | 7/2004 | Saito et al. |
| 6,765,824 B2 | 7/2004 | Kishi et al. |

(Continued)

FOREIGN PATENT DOCUMENTS

JP    2002-280637    9/2002

(Continued)

OTHER PUBLICATIONS

M. Motoyoshi, et al., "A study for 0.18um High-Density MRAM", 2004 Symposium on VLSI Technology Digest of Technical Papers, 2004, pp. 22-23.

(Continued)

*Primary Examiner*—Kiesha L Rose
*Assistant Examiner*—Igwe U Anya
(74) *Attorney, Agent, or Firm*—Oblon, Spivak, McClelland, Maier & Neustadt, L.L.P.

(57) ABSTRACT

A magnetic memory device comprising, a magneto-resistance effect element that is provided at an intersection between a first write line and a second write line. And the magneto-resistance effect element having, an easy axis that extends in a direction of extension of the first write line, and a first conductive layer for electrical connection to the magneto-resistance effect element, the first conductive layer having sides which are in flush with sides of the magneto-resistance effect element.

5 Claims, 18 Drawing Sheets

U.S. PATENT DOCUMENTS

| | | |
|---|---|---|
| 6,797,536 B2 | 9/2004 | Yoda et al. |
| 6,798,691 B1 | 9/2004 | Ounadjela et al. |
| 6,812,040 B2 | 11/2004 | Kyler et al. |
| 6,833,573 B1 | 12/2004 | Worledge |
| 6,855,563 B2 | 2/2005 | Motoyoshi |
| 6,914,284 B2 | 7/2005 | Nakajima et al. |
| 6,914,806 B2 | 7/2005 | Kunikiyo |
| 6,949,779 B2 | 9/2005 | Kai et al. |
| 6,952,364 B2 | 10/2005 | Lee et al. |
| 6,956,270 B2 | 10/2005 | Fukuzumi |
| 6,960,815 B2 | 11/2005 | Yoda et al. |
| 6,965,138 B2 | 11/2005 | Nakajima et al. |
| 7,038,939 B2 | 5/2006 | Amano et al. |
| 7,095,071 B2 | 8/2006 | Fukuzumi et al. |
| 7,099,176 B2 | 8/2006 | Lin et al. |
| 7,267,998 B2 | 9/2007 | Fukuzumi |
| 2002/0145902 A1* | 10/2002 | Kunikiyo et al. ............... 365/97 |
| 2004/0175887 A1* | 9/2004 | Cha ........................... 438/257 |
| 2004/0246777 A1* | 12/2004 | Maejima et al. ............. 365/173 |
| 2005/0205908 A1 | 9/2005 | Fukuzumi |
| 2005/0242384 A1 | 11/2005 | Iwata et al. |
| 2005/0275000 A1 | 12/2005 | Kajiyama et al. |
| 2006/0082933 A1 | 4/2006 | Kishi et al. |
| 2006/0083057 A1 | 4/2006 | Nakayama et al. |
| 2007/0012972 A1 | 1/2007 | Nakayama et al. |
| 2007/0013015 A1 | 1/2007 | Kai et al. |

FOREIGN PATENT DOCUMENTS

| | | |
|---|---|---|
| JP | 2003-78112 | 3/2003 |
| JP | 2004-88045 | 3/2004 |
| JP | 2004-128067 | 4/2004 |

OTHER PUBLICATIONS

Youfeng Zheng, et al., "Switching field variation in patterned submicron magnetic film elements", J. Appl. Phys vol. 81, No. 8, Apr. 1997, pp. 5471-5473.

Roy Scheuerlein, et al., "A10ns Read and Write Non-Volatile Memory Array Using a Magnetic Tunnel Junction and FET Switch in each Cell" ISSCC 2000 Technical Digest, 2000 International Solid-State Circuits Conference, Session 7, Feb. 2000, pp. 128-129.

Roy Scheuerlein, et al., "A10ns Read and Write Non-Volatile Memory Array Using a Magnetic Tunnel Junction and FET Switch in each Cell" ISSCC 2000 Slide Supplement, Session 7, Feb. 2000, pp. 94-95.

Xiu-Feng Han, et al., "Fabrication of high-magnetoresistance tunnel junctions using $Co_{75}Fe_{25}$ ferromagnetic electrodes", Applied Physics Letters, vol. 77, No. 2, Jul. 2000, pp. 283-285.

K. Inomata, et al., "MRAM Technology", Sipec Co. (Japan), Feb. 2002, pp. 23-24, Section 1, 2-6.

U.S. Appl. No. 11/244,153, filed Apr. 20, 2006, Kishii, et al.*
U.S. Appl. No. 11/245,353, filed Apr. 20, 2006, Nakayama, et al.*
U.S. Appl. No. 11/378,358, filed Jan. 18, 2007, Kai, et al.*
U.S. Appl. No. 11/389,110, filed Jan. 18, 2007, Nakayama, et al.*

* cited by examiner

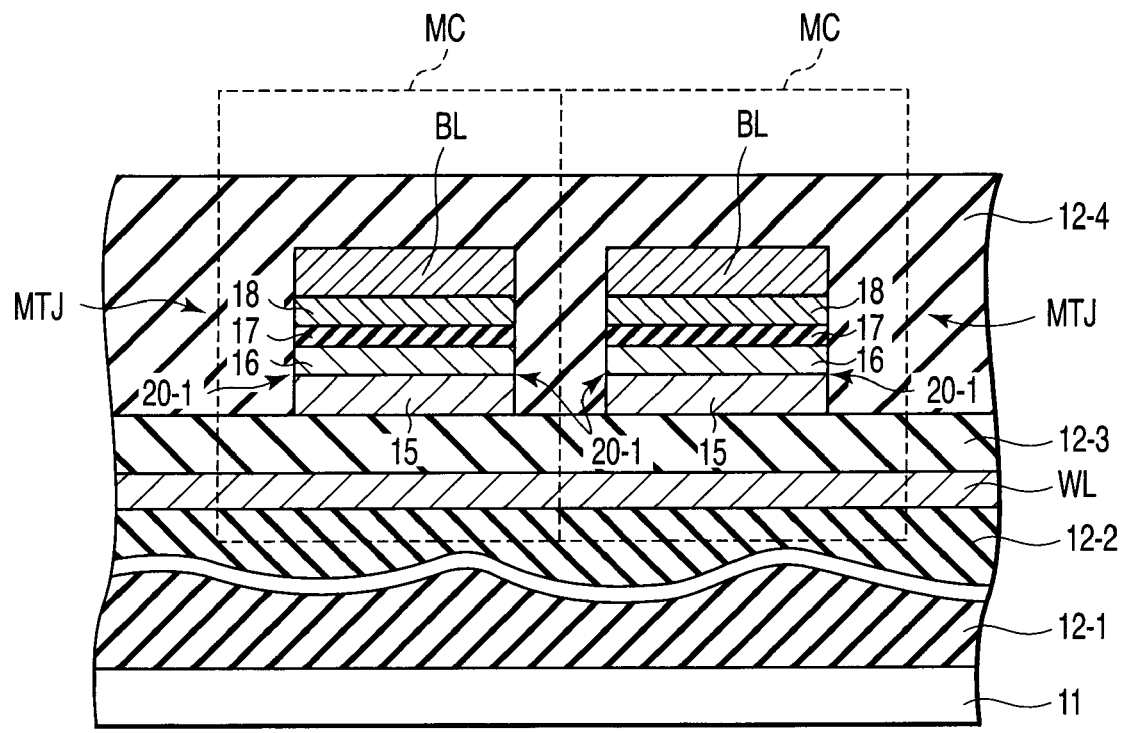
F I G. 2
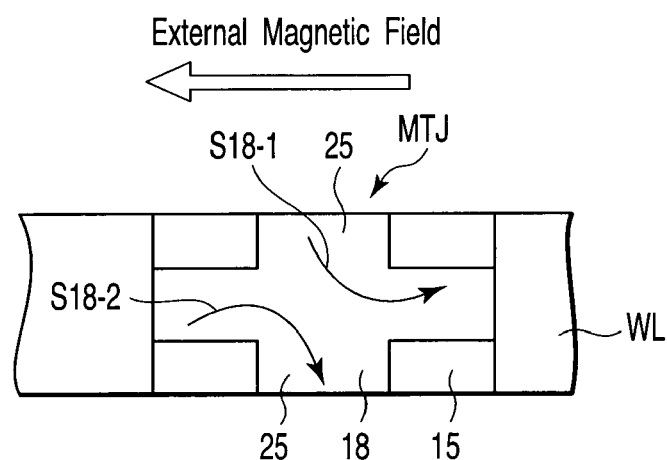
F I G. 3

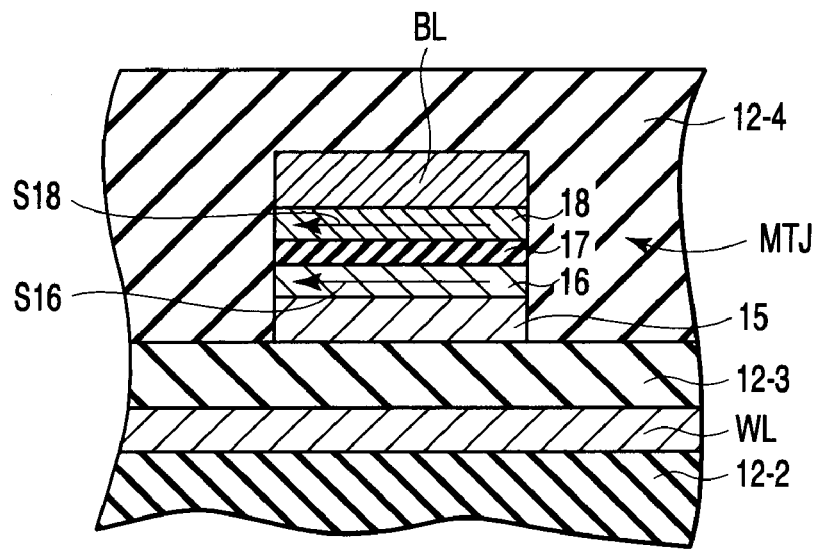
F I G. 4
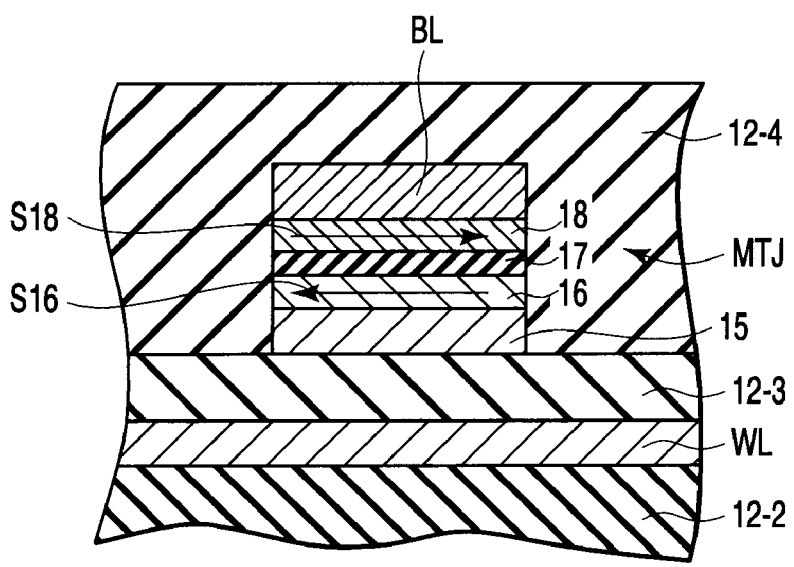
F I G. 5

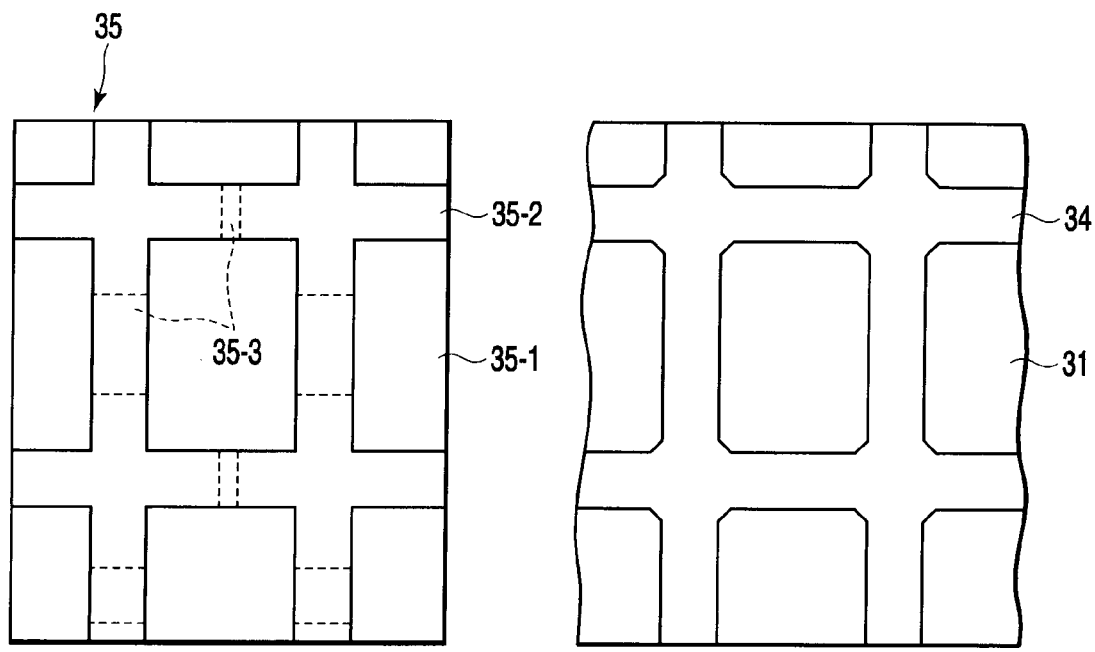
F I G. 5 9          F I G. 6 0
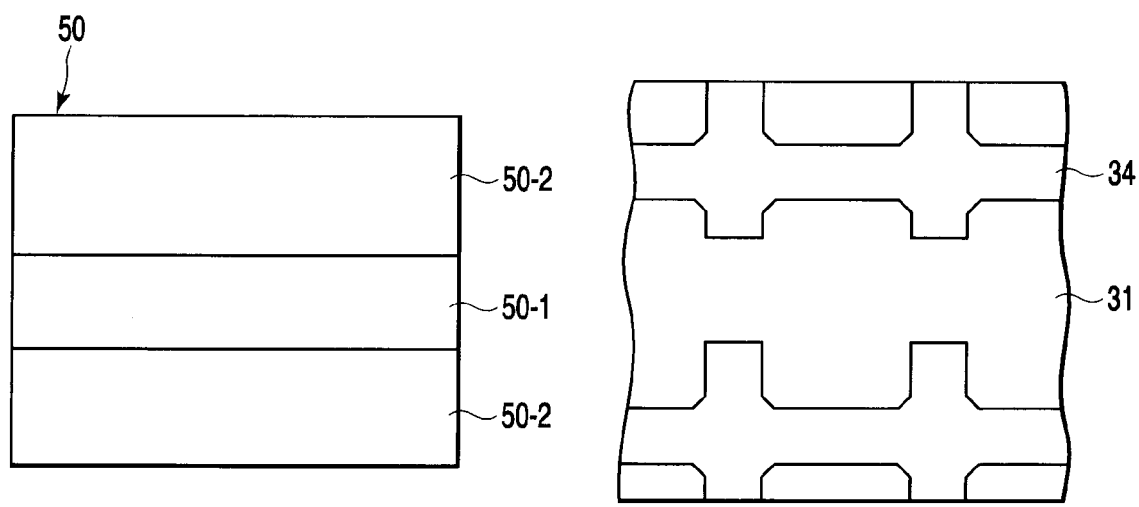
F I G. 6 1          F I G. 6 2

MRAM AND METHOD OF MANUFACTURING THE SAME

CROSS-REFERENCE TO RELATED APPLICATIONS

The present Divisional application claims the benefit of priority under 35 U.S.C. §120 to application Ser. No. 10/933,247, filed on Sep. 3, 2004, which is based upon and claims the benefit of priority from the prior Japanese Patent Application No. 2004-133445, filed Apr. 28, 2004, the entire contents of which are incorporated herein by reference.

BACKGROUND OF THE INVENTION

1. Field of the Invention

The present invention relates generally to a magnetic memory device and a method of manufacturing the same, and more particularly to a magnetic random access memory (MRAM) and a method of manufacturing the same.

2. Description of the Related Art

In recent years, a variety of memories, which store data based on novel principles, have been proposed. Of these, there is known a magnetic random access memory (MRAM) making use of a tunneling magneto-resistive (TMR) effect, which was proposed by Roy Scheuerlein et al. An example of the MRAM including a so-called 1T1MTJ type memory cell (1T/1MTJ cell) is disclosed in "A 10 ns Read and Write Non-Volatile Memory Array Using a Magnetic Tunnel Junction and FET Switch in each Cell", ISSCC2000 Technical Digest, p. 128.

As is described in this document, in the 1T1MTJ type MRAM, a conductor layer MX for electrically connecting one end of the current path of the transistor to the MTJ element is provided so as to project from the MTJ element. Consequently, the projecting region becomes a so-called dead space, and this is disadvantageous in miniaturization of memory cells.

There is a fabrication step in which a photoresist is coated on a projected shape that becomes an MTJ element and a pattern corresponding to the plan-view shape of the MTJ element is transferred onto the photoresist. In this step, due to optical characteristics, there is a tendency that the magnetic material shrinks in the longitudinal direction (easy-axis direction) of the MTJ element. As a result, the shape of the MTJ element differs from the target design, the target shape, and also the characteristics thereof differ from the estimated characteristics at the stage of design. For example, a difference in area leads to variation in resistance, variation in reverse magnetic field in a write mode, and variation in length in the longitudinal direction. Consequently, a stray magnetic field from the pinned layer would vary, and the reverse magnetic field in a "1" write mode and that in a "0" write mode would vary.

BRIEF SUMMARY OF THE INVENTION

According to an aspect of the present invention, there is provided a magnetic memory device comprising, a magneto-resistance effect element that is provided at an intersection between a first write line and a second write line, the magneto-resistance effect element having an easy axis that extends in a direction of extension of the first write line, and a first conductive layer for electrical connection to the magneto-resistance effect element, the first conductive layer having sides which are in flush with sides of the magneto-resistance effect element.

According to another aspect of the present invention, there is provided a method of manufacturing a magnetic memory device, comprising, forming a magneto-resistance effect element layer on a first conductive layer, patterning the magneto-resistance effect element layer, using a first mask with such a pattern that at least an arm portion in an easy-axis direction extends to an adjacent magneto-resistance effect element, and patterning the magneto-resistance effect element layer and the first conductive layer using a second mask with a matrix pattern, and separating the magneto-resistance effect element layer and the first conductive layer at a time.

According to still another aspect of the present invention, there is provided a method of manufacturing a magnetic memory device, comprising, forming a magneto-resistance effect element layer on a first conductive layer, patterning the magneto-resistance effect element layer, using a first mask with such a pattern that arm portions in an easy-axis direction and a hard-axis direction extend to adjacent magneto-resistance effect elements, and patterning the magneto-resistance effect element layer and the first conductive layer using a second mask with a matrix pattern, and separating the magneto-resistance effect element layer and the first conductive layer at a time.

BRIEF DESCRIPTION OF THE SEVERAL VIEWS OF THE DRAWING

FIG. 2 is a cross-sectional view taken along line 2-2 in FIG. 1;

FIG. 3 is a schematic plan view that illustrates "C" magnetization configuration in the free layer of the magnetic memory device according to the first embodiment;

FIG. 4 is a cross-sectional view that schematically illustrates the "1" state of the magnetic memory device according to the first embodiment;

FIG. 5 is a cross-sectional view that schematically illustrates the "0" state of the magnetic memory device according to the first embodiment;

FIG. 59 is a plan view that schematically shows a photomask in a fabrication step of the magnetic memory device according to Modification 5;

FIG. 60 is a plan view that schematically illustrates a fabrication step of the magnetic memory device according to Modification 5;

FIG. 61 is a plan view that schematically shows a photomask in a fabrication step of the magnetic memory device according to Modification 5;

FIG. 62 is a plan view that schematically illustrates a fabrication step of the magnetic memory device according to Modification 5;

DETAILED DESCRIPTION OF THE INVENTION

Figure 1:
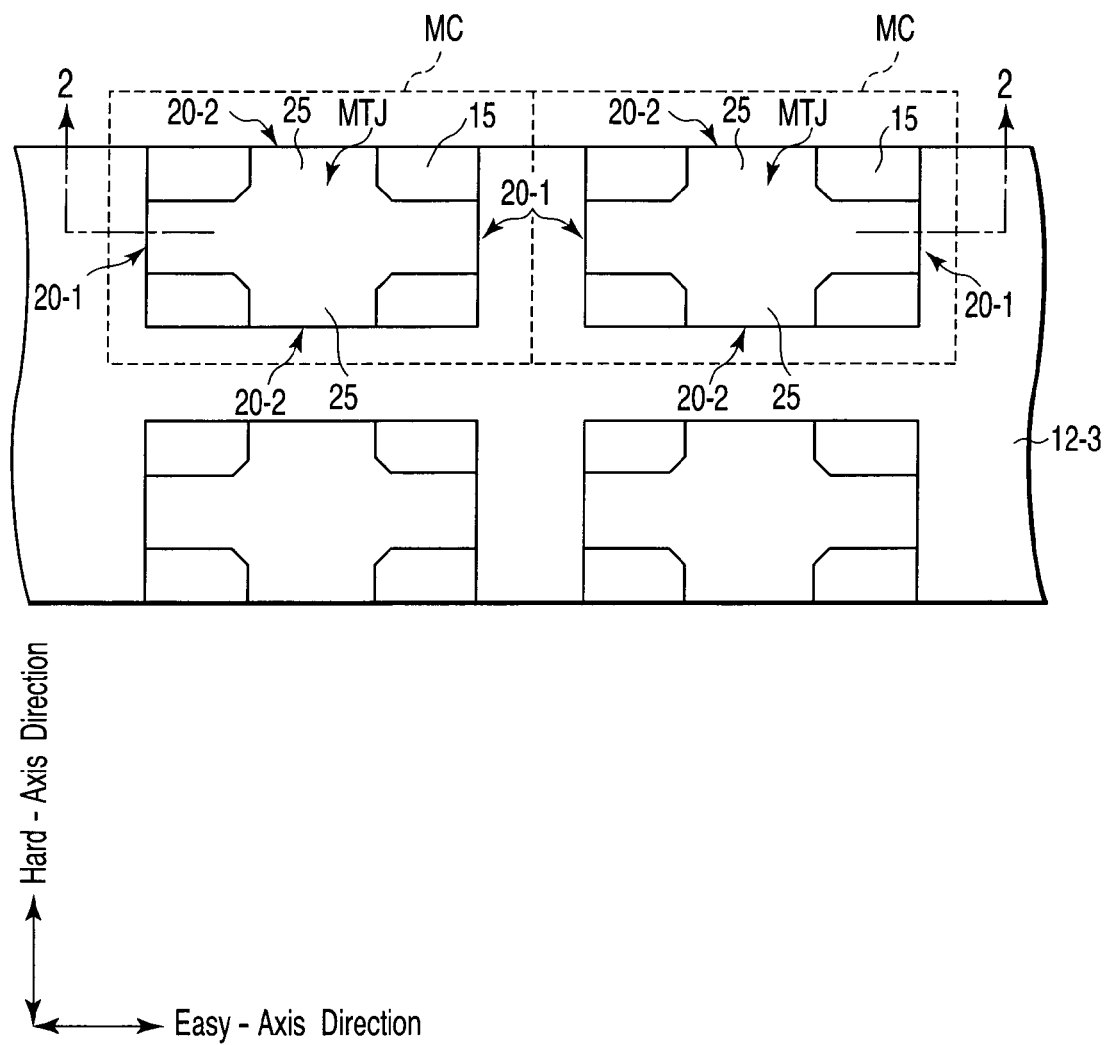
FIG. 1 is a plan view that schematically shows a magnetic memory device according to a first embodiment of the present invention.

Embodiments of the present invention will now be described with reference to the accompanying drawings. In the descriptions below, common parts are denoted by like reference numerals throughout the drawings.

First Embodiment

Basic Architecture

A magnetic memory device according to a first embodiment of the present invention and a method of manufacturing the same are described referring to FIG. 1 to FIG. 10. FIG. 1 is a plan view that schematically shows a magnetic memory device according to the first embodiment. FIG. 2 is a cross-sectional view taken along line 2-2 in FIG. 1.

A word line WL (write line) is provided over a major surface of a semiconductor substrate 11 with interlayer films 12-1 and 12-2 interposed therebetween. An underlying conductive layer 15 and an MTJ (Magnetic Tunnel Junction) element (magneto-resistance effect element) are provided over the word line WL, with an insulation layer 12-3 interposed. A bit line BL (write line) that crosses the word line WL is provided on the MTJ element (depiction of the bit line BL is omitted in FIG. 1). An insulation layer 12-4 is provided over the bit line BL so as to fill the space between MTJ elements. In FIG. 1 and FIG. 2, a boxed region indicated by a broken line designates a "1" bit memory cell MC.

The MTJ element is configured, for example, such that a insulating barrier layer 17 is sandwiched between ferromagnetic layers 16 and 18. The ferromagnetic layer (pinned layer) 16 is provided on the underlying conductive layer 15. The insulating barrier layer 17 is provided on the ferromagnetic layer 16. The ferromagnetic layer (free layer) 18 is provided on the insulating barrier layer 17. The MTJ element stores "1" data or "0"! data in a nonvolatile state, depending on whether the directions of magnetization of the two ferromagnetic layers 16 and 18 are parallel or antiparallel. The stored "1" data or "0" data is read out by making use of the tunneling magneto-resistance (TMR) effect of the magnetic tunnel junction (MTJ).

In a hard-axis direction (i.e. a direction in which magnetization is hard to occur), the underlying conductive layer 15 and a part 20-1 of a side wall of the MTJ element are formed to be continuous with each other. In other words, the end portion of the underlying conductive layer 15 and the end portion of the MTJ element are formed to be substantially flush with each other. The end portion of the underlying conductive layer 15 does not project from the MTJ element in an easy-axis direction (i.e. a direction in which magnetization is easy to occur).

Similarly, in the easy-axis direction, the underlying conductive layer 15 and a part 20-2 of a side wall of the MTJ element are formed to be continuous with each other. In other words, the end portion of the underlying conductive layer 15 and the end portion of the MTJ element are formed to be substantially flush with each other. The end portion of the underlying conductive layer 15 does not project from the MTJ element in the hard-axis direction.

Each MTJ element has a pair of symmetric projection portions 25 in the hard-axis direction. Each MTJ element has a cruciform plan-view shape.

The read/write operations of each MTJ element will now be described with reference to FIG. 3 to FIG. 6.

To begin with, the read operation is described. Information in the MTJ element is read out by detecting the resistance value of the MTJ element. When the magnetization direction $S_{16}$ of the ferromagnetic layer 16 is parallel to the magnetization direction $S_{18}$ of the ferromagnetic layer 18, as shown in FIG. 4, the resistance value of the MTJ element is minimum, and the MTJ element is set, for example, in a "1" state. On the other hand, when the magnetization direction $S_{16}$ of the ferromagnetic layer 16 is antiparallel to the magnetization direction $S_{18}$ of the ferromagnetic layer 18, as shown in FIG. 5, the resistance value of the MTJ element is maximum, and the MTJ element is set, for example, in a "0" state. In order to realize the parallel and antiparallel states, the magnetization direction $S_{16}$ of the ferromagnetic layer (pinned layer) 16 is fixed (i.e. pinned) so as not to be reversed by a magnetic field that is generated by a write operation, and the magnetization direction $S_{18}$ of the ferromagnetic layer (free layer) 18 is reversed by a magnetic field that is generated by the write operation. Thus, the magnetization direction $S_{18}$ of the ferromagnetic layer (free layer) 18 can be reversed in the write operation, and the parallel and antiparallel states can be switched.

The "parallel" in this context means that the magnetization directions $S_{16}$ and $S_{18}$ of the two ferromagnetic layers 16 and 18 are the same. The "antiparallel" means that the magnetization directions $S_{16}$ and $S_{18}$ of the two ferromagnetic layers 16 and 18 are opposite (arrows indicate directions of magnetization).

To be more specific, the read operation is executed by causing a current to flow successively in the underlying conductive layer 15, magnetic layer 16, insulating barrier layer 17, magnetic layer 18 and bit line BL. Further, the current is sensed and amplified by, e.g. a sense amplifier (not shown), which is connected to the bit line BL. Thus, the resistance value is detected, and the read operation is completed.

For example, as is shown in FIG. 4, when the magnetization direction $S_{16}$ of the ferromagnetic layer 16 is parallel to the magnetization direction $S_{18}$ of the ferromagnetic layer 18, the resistance value of the MTJ element (i.e. resistance between the underlying conductive layer 15 and magnetic layer 18) is minimum, and "1" data, for instance, is read out.

Next, the write operation is described. The write operation is executed by reversing the magnetization direction $S_{18}$ of the ferromagnetic layer 18 by application of a composite magnetic field that is generated by the word line WL and bit line BL. To start with, a current is let to flow in the word line WL. As a result, a magnetic field is generated around the word line WL according to so-called Ampere's law. Similarly, a current is let to flow in the bit line BL, thereby generating a magnetic field around the bit line BL. The composite magnetic field that is generated by the word line WL and bit line BL reverses only the magnetization direction $S_{18}$ of the ferromagnetic layer 18 of the MTJ element. Thus, data can be written only in an MTJ element of a plurality of arrayed MTJ elements, which is provided at an intersection between a selected word line WL and a selected bit line BL.

For example, as is shown in FIG. 5, when the magnetization direction $S_{16}$ of the ferromagnetic layer 16 is antiparallel to the magnetization direction $S_{18}$ of the ferromagnetic layer 18, the resistance value of the MTJ element becomes is maximum, and "0" data, for instance, is written.

In usual cases, an antiferromagnetic layer is provided between the underlying conductive layer 15 and ferromagnetic layer (pinned layer) 16. Depiction of the antiferromagnetic layer, which fixes the magnetization direction $S_{16}$ of the ferromagnetic layer 16, is omitted here.

Figure 6:
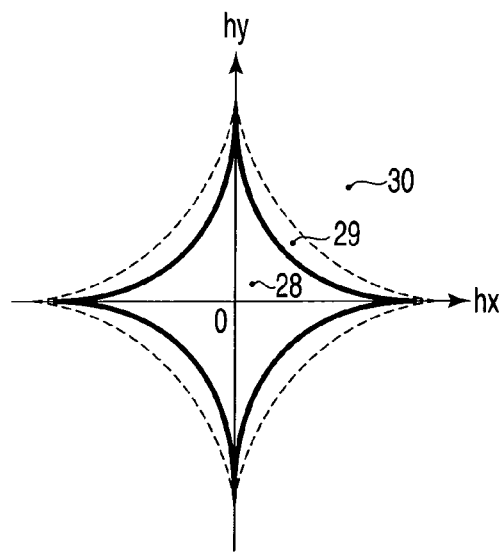
FIG. 6 schematically shows an asteroid curve of the magnetic memory device according to the first embodiment and an asteroid curve of a conventional magnetic memory device.

Next, an asteroid curve of the MTJ element according to this embodiment is described referring to FIG. 6. FIG. 6 schematically shows an asteroid curve of the MTJ element according to this embodiment and an asteroid curve of a conventional MTJ element.

In FIG. 6, a broken line indicates the asteroid curve of the conventional MTJ element, and a solid line indicates the asteroid curve of the MTJ element according to this embodiment. The solid-line asteroid curve is "recessed" inward (i.e. set back toward the origin O), relative to the broken-line asteroid curve.

Assume that the magnitude of an applied magnetic field in the easy-axis direction of the MTJ element is hx, and the magnitude of an applied magnetic field in the hard-axis direction is hy. If the easy-axis field hx and hard-axis field hy are applied with their magnitudes being varied, magnetization reversal (switching) occurs. An asteroid curve indicates threshold values of magnetization reversal, which is obtained by plotting the values hx and hy on a plane.

As regards the solid-line asteroid curve, if a composite vector of magnetic fields, which are applied to the ferromagnetic layer 18 of the MTJ element, falls within the region of the solid-line asteroid curve (i.e. the region including the origin O), the magnetization direction $S_{18}$ of the ferromagnetic layer 18 does not reverse. On the other hand, if the composite vector is in a region outside the solid-line asteroid curve (i.e. the region not including the origin O), the magnetization direction $S_{18}$ of the ferromagnetic layer 18 reverses. Thus, if the area of the region surrounded by the asteroid curve decreases, the magnitude of the critical field that is needed for magnetization reversal becomes smaller and accordingly the write current can be reduced.

For example, a point 28 in FIG. 6 is within the region of the solid-line asteroid curve. Thus, the magnetization direction $S_{18}$ of the ferromagnetic layer 18 of the MTJ element does not reverse. On the other hand, points 29 and 30 are outside the region of the solid-line asteroid curve, so the magnetization direction $S_{18}$ of the ferromagnetic layer 18 of the MTJ element reverses.

As mentioned above, each of the MTJ elements according to the present embodiment has symmetric projection portions 25 in the hard-axis direction, and each MTJ element has a cruciform plan-view shape.

In the case where an external magnetic field is generated in a direction of an arrow, as shown in FIG. 3, by causing a current to flow only in the bit lines BLs (not shown) that is arranged in the hard-axis direction, "C" magnetization configuration in the free layer $S_{18-1}$, $S_{18-2}$ occurs due to the projection portions 25 of the ferromagnetic layer 18. A reverse magnetic field increases in the state in which magnetization directions at ends of the easy axis are antiparallel. A reverse magnetic field becomes greater, compared to an MTJ element with no projection portions. The same applies to the case where a current is let to flow in the word line WL alone, thereby generating a magnetic field only in the hard-axis direction. In the case of the magnetization reversal using the composite field of the hard-axis field and easy-axis field, magnetization reversal occurs with a multi-domain structure, compared to the MTJ element with no projection portions wherein magnetization reversal occurs with a substantially single-domain structure. In the multi-domain structure, the volume of each domain is less than that of a single-domain structure, and hence the reverse field decreases. By virtue of this advantage, in the case of the composite field of the hard-axis field and easy-axis field, magnetization reversal (switching) can be caused with a less magnetic field. In the case of the hard-axis field alone or the easy-axis field alone, a greater magnetic field is needed to cause magnetization reversal (switching). Hence, the asteroid curve can be "recessed" inward (toward the origin O).

Thus, in a region (including point 29) defined between the solid-line asteroid curve and broken-line asteroid curve, magnetization reversal can be caused in the MTJ element according to the present embodiment.

As has been described above, the underlying conductive layer 15 and the part 20-1 of the side wall of the MTJ element are formed to be continuous with each other in the hard-axis direction. In other words, the end portion of the underlying conductive layer 15 and the end portion of the MTJ element are formed to be substantially flush with each other. The end portion of the underlying conductive layer 15 does not project from the MTJ element in the easy-axis direction.

Hence, the insulation layer 12-4 is not present on the underlying conductive layer 15, and no stress acts in the underlying conductive layer 15 due to the insulation layer 12-4. Accordingly, no tensile stress or compression stress occurs in the easy-axis direction of the MTJ element. Therefore, non-uniformity in the switching field of the MTJ element can be suppressed, and the reliability in switching can be enhanced.

Furthermore, the end portion of the underlying conductive layer 15 and the end portion of the MTJ element are formed to be substantially flush with each other. The end portion of the underlying conductive layer 15 does not project from the MTJ element in the easy-axis direction. Therefore, the cell area in the easy-axis direction can be reduced, and this is advantageous in miniaturization.

Similarly, in the easy-axis direction, the underlying conductive layer 15 and the part 20-2 of the side wall of the MTJ element are formed to be continuous with each other. In other words, the end portion of the underlying conductive layer 15 and the end portion of the MTJ element are formed to be substantially flush with each other. The end portion of the underlying conductive layer 15 does not project from the MTJ element in the hard-axis direction.

Therefore, by the same advantage as mentioned above, no tensile stress or compression stress occurs in the hard-axis direction of the MTJ element. Therefore, non-uniformity in the switching field of the MTJ element can be suppressed, and the reliability in switching can be enhanced.

By the same advantage as mentioned above, the cell area in the hard-axis direction can be reduced, and this is advantageous in miniaturization.

Besides, the MTJ element has the cruciform plan-view shape. Therefore, the switching magnetic field, that is, the write current and power consumption, can be reduced. Consequently, the asteroid curve is recessed inward, the write current can be reduced, and a write operation margin for erroneous write can be increased. Thus, the selectivity of MTJ elements can be enhanced.

Next, a method of manufacturing the magnetic memory device according to the present embodiment is described referring to FIG. 7 to FIG. 10, taking the MRAM shown in FIG. 1 or FIG. 2 by way of example.

Through well-known fabrication steps, an insulation layer 12-1, an insulation layer 12-2, a word line WL and an insulation layer 12-3 are formed on a major surface of the semiconductor substrate 11.

Then, on the insulation layer 12-3, CVD (Chemical Vapor Deposition), for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated (not illustrated).

Figure 7:
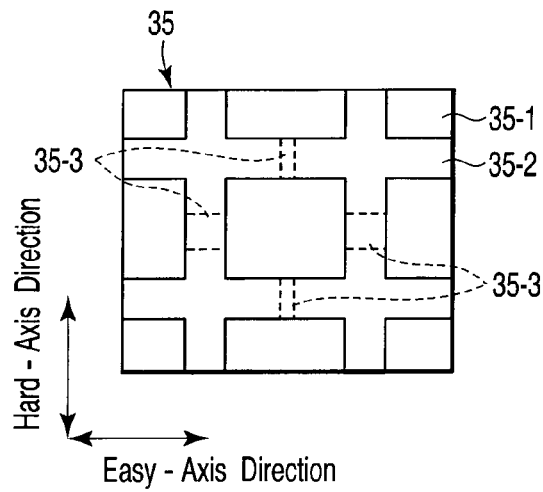
FIG. 7 is a plan view that schematically shows a photomask in a fabrication step of the magnetic memory device according to the first embodiment.

Using a photomask (MTJ mask) 35 as shown in FIG. 7, the photoresist is exposed and developed. A pattern 35-2 of the photomask 35 is thus transferred on the photoresist. The photomask 35 has such a grid pattern that arm portions 35-3 of the MTJ element, which will finally have a cruciform shape in the easy-axis direction and hard-axis direction, extend to adjacent MTJ elements on a glass mask 35-1.

Figure 8:
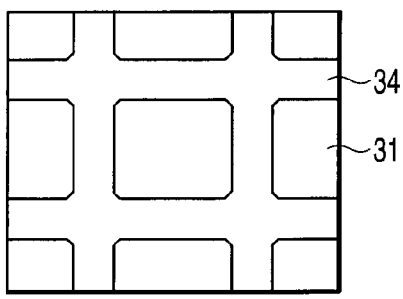
FIG. 8 is a plan view that schematically illustrates a fabrication step of the magnetic memory device according to the first embodiment.

As is shown in FIG. 8, using the pattern-transferred photoresist as a mask, anisotropic etching such as RIE (Reactive Ion Etching) is carried out to transfer the pattern 35-2 on the protection film. Further, the photoresist is removed. The protection mask on which the pattern 35-2 is transferred is used as a mask, and anisotropic etching such as RIE is effected down to the surface of the conductive material 31. Thus, the magnetic material 34, insulation material 33 and magnetic material 32 are formed in a grid shape.

Subsequently, a protection film is deposited on the magnetic material 34 once again, and a photoresist is further coated on the conductive material 31 (not illustrated).

Figure 9:
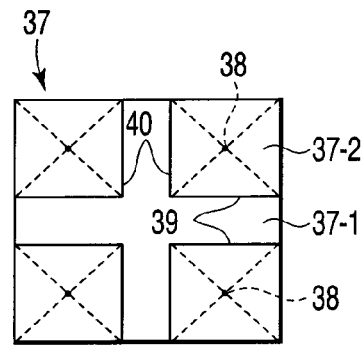
FIG. 9 is a plan view that schematically shows a photomask in a fabrication step of the magnetic memory device according to the first embodiment.

Using a photomask (MX mask) 37 as shown in FIG. 9, the photoresist is exposed and developed, and a pattern of the photomask 37 is transferred on the photoresist. The photomask 37 is formed such that rectangular patterns 37-2 are provided on a glass mask 37-1. The rectangular patterns 37-2 are configured such that rectangles are arranged in a matrix, and each rectangle has an intersection 38 of diagonals, which corresponds to an associated intersection of the grid-pattern of the magnetic material 34, 32 and insulation material 33, a long side 39 corresponding to the easy-axis direction, and a short side 40 corresponding to the hard-axis direction.

Figure 10:
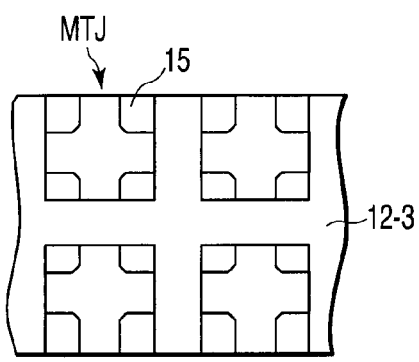
FIG. 10 is a plan view that schematically illustrates a fabrication step of the magnetic memory device according to the first embodiment.

Thereafter, as shown in FIG. 10, using the pattern-transferred photoresist as a mask, anisotropic etching such as RIE is carried out to transfer the pattern 37-2 onto the protection film. Further, the photoresist is removed. The protection film, on which the pattern 37-2 is transferred, is used as a mask, and anisotropic etching such as RIE is performed down to the surface of the insulation layer 12-3. Thereby, the extended arm portions of the magnetic layer 32, conductive layer 33 and magnetic layer 34 are separated in the easy-axis direction and hard-axis direction. The MTJ elements are thus formed. At the same time, the conductive layer 31 is separated in association with the individual MTJ elements, and the underlying conductive layer 15 is formed.

Subsequently, using well-known fabrication steps, an insulation layer 12-4 and a bit line BL are formed, and the magnetic memory device shown in FIG. 1 or 2 is formed.

As has been described above, the photomask (MTJ mask) 35 is first used to form a grid pattern in which the arm portions 35-3 formed in the easy-axis direction and hard-axis direction extend to adjacent MTJ elements (FIG. 8).

Then, using the photomask (MX mask) 37, the arm portions 35-3 that extend to the MTJ elements are separated to form the MTJ elements and conductor material 31 in a matrix (FIG. 10).

Thus, the underlying conductive layer 15 and the portions 20-1 and 20-2 of side walls of the MTJ element can be formed to be continuous in the easy-axis direction and hard-axis direction. Since there is no need to provide the underlying conductive layer 15 in the easy-axis direction and hard-axis direction, the cell size and cell area in the easy-axis direction and hard-axis direction can be reduced.

In this case, since the MTJ element requires use of shape anisotropy, the cell size does not become $8F^2$ (F=minimum process dimension), unlike a DRAM (Dynamic Random Access Memory). The cell size increases in the easy-axis direction. In this embodiment, the cell size can be reduced in the easy-axis/hard-axis direction, and this is important for miniaturization.

In this embodiment, compared to the prior art, only two photomasks (MTJ mask 35 and MX mask 37) are used. No photomask is additionally used. Therefore, there is no increase in manufacturing cost.

[Modification 1 (Plan-View Shape)]

Magnetic memory devices according to Modification 1 of the first embodiment will now be described with reference to FIG. 11 to FIG. 23. A description of the parts common to those in the first embodiment is omitted.

In Modification 1, other plan-view shapes, with which the "C" magnetization configuration in the free layer tends to easily occur.

FIGS. 11 to 20 are plan views that schematically show plan-view shapes of MTJ elements according to Modification 1. In each of the MTJ elements shown in FIGS. 11 to 20, the underlying conductive layer 15 and parts of side walls of the MTJ element (i.e. parts 20-1 of side walls or parts 20-2 of side walls) are formed to be continuous in at least the easy-axis direction or hard-axis direction.

Figure 11:
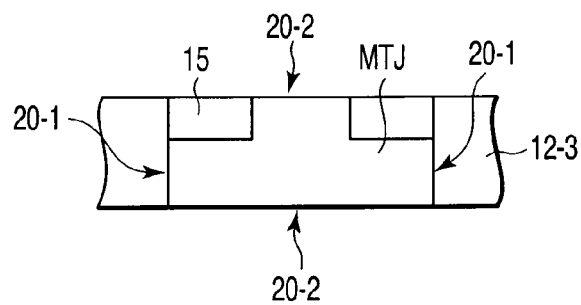
FIGS. 11 to 20 are plan views that schematically show magnetic memory devices according to Modification 1.
Figure 12:
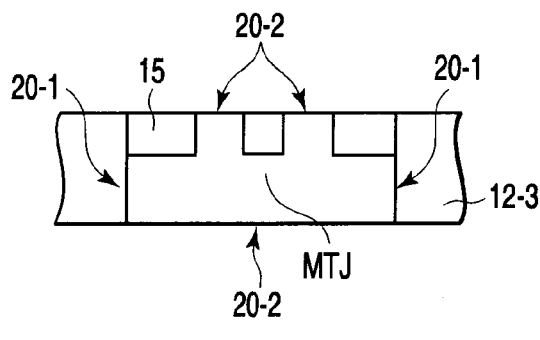
Figure 13:
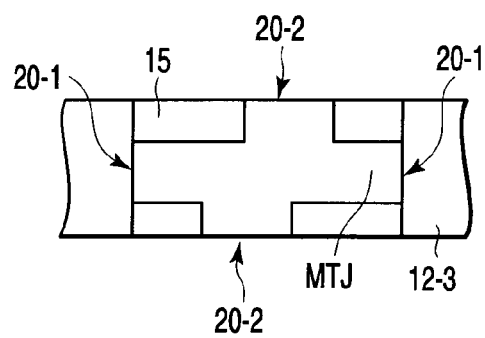
Figure 14:
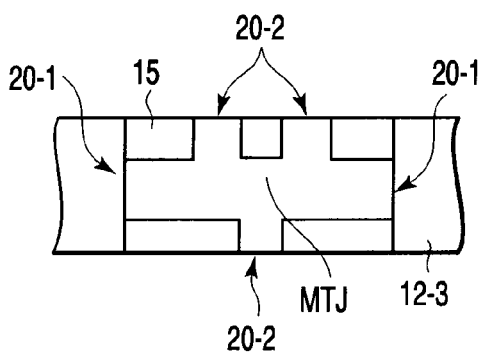

The MTJ element shown in FIG. 11 is provided with one projection portion that extends in one direction along the hard axis ("T shape"). The MTJ element shown in FIG. 12 is provided with two projection portions that extend in one direction along the hard axis. The MTJ element shown in FIG. 13 is provided with two projection portions that extend in opposite directions along the hard axis in an asymmetric fashion. The MTJ element shown in FIG. 14 is provided with two projection portions that extend in one direction along the hard axis, and with one projection portion that extends in the other direction along the hard axis.

In the MTJ elements shown in FIG. 3, FIG. 11, FIG. 12, FIG. 13 and FIG. 14, an angle of about 90° is defined between the angular portion or projection portion and the easy axis of the MTJ element. However, in an actual plan-view shape, the angular portion may be formed in a gentle shape, and the angle between the projection portion and the hard axis of the MTJ element may be greater than 90°. In each of the MTJ elements with plan-view shapes, however, the presence of any one of the projection portions can cause "C" magnetization configuration in the free layer. FIGS. 15 to 20 show some examples of such plan-view shapes of MTJ elements.

And the MTJ elements have a plan-view shape with a curvature that is nonconstant and takes a positive value and a negative value, while an outer periphery of the plan-view shape is traced in one direction. The MTJ elements have a plan-view shape with a curvature that is nonconstant and continuously and cyclically varies from a positive value to a negative value, or from a negative value to a positive value, while an outer periphery of the plan-view shape is traced in one direction.

Figure 15:
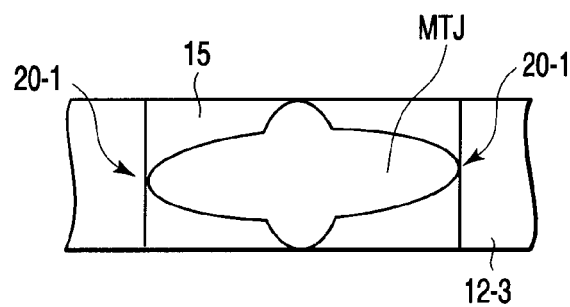
Figure 16:
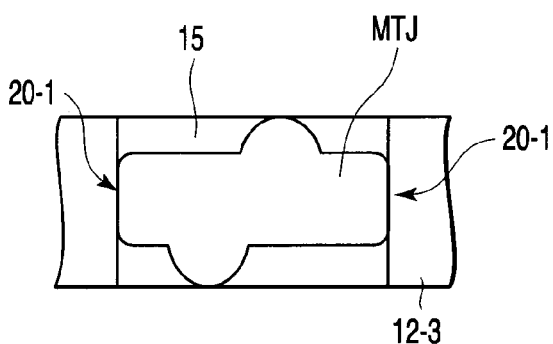

For example, let us consider a curvature of a plan-view shape of an MTJ element shown in FIG. 15 in a case where the outer periphery of the plan-view shape is traced counterclockwise from a leftmost end point. The curvature begins with a positive value and once takes a negative value at a beginning portion of a projecting region. Then, the curvature takes a positive value at the projecting region, and takes a negative value once again at an ending portion of the projecting region. At a rightmost end point in the easy-axis direction, the curvature takes a positive value. Then, the curvature takes a negative value at a beginning portion of another projecting region, and takes a positive value at the projecting region. Further, the curvature takes a negative value at an ending portion of the projecting region, and then takes a positive value, thus returning to the leftmost end point. This curvature is similarly applicable to the plan-view shape of an MTJ element shown in FIG. 16.

Figure 17:
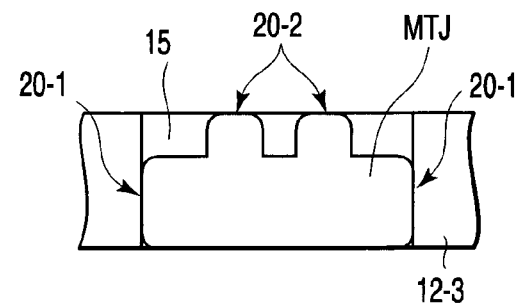
Figure 18:
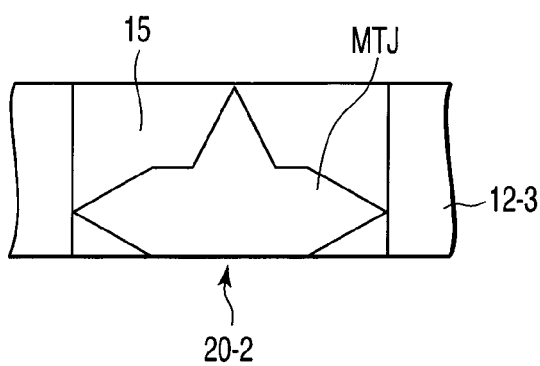
Figure 19:
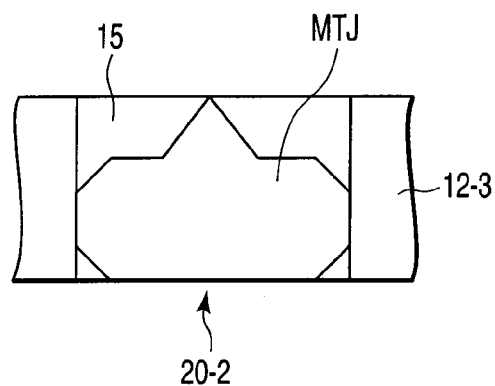
Figure 20:
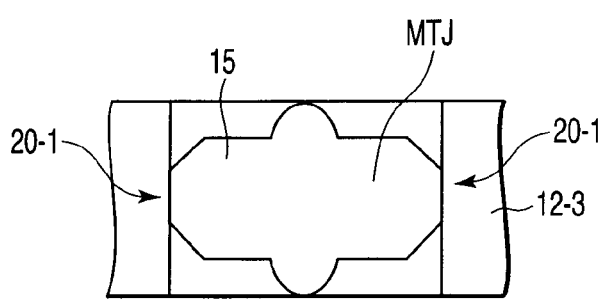

Further, let us consider a curvature of a plan-view shape of an MTJ element shown in FIG. 17 in a case where the outer periphery of the plan-view shape is traced clockwise from a leftmost end point. The curvature begins with a negative value and once takes a positive value at a beginning portion of a projecting region. The curvature takes a negative value at the projecting region, and takes a positive value once again at an ending portion of the projecting region. The curvature then takes a zero value, and a positive value at a beginning portion of another projecting region. The curvature takes a negative value at the projecting region, and takes a positive value once again at an ending portion of the projecting region. The curvature takes a negative value at a rightmost end point in the easy-axis direction. Subsequently, the curvature once takes a zero value, thus returning to the leftmost end point.

Figure 21:
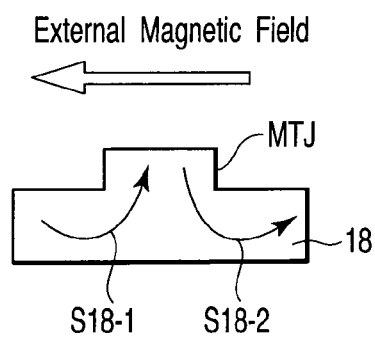
FIG. 21 is a plan view that schematically shows "C" magnetization configuration in the free layer of the magnetic memory device according to Modification 1.
Figure 22:
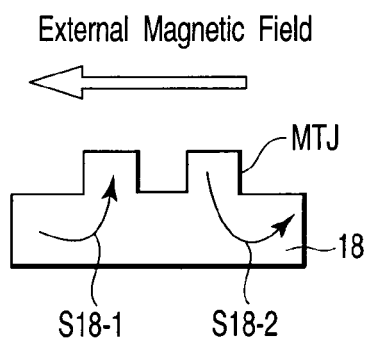
FIG. 22 is a plan view that schematically shows "C" magnetization configuration in the free layer of the magnetic memory device according to Modification 1.
Figure 23:
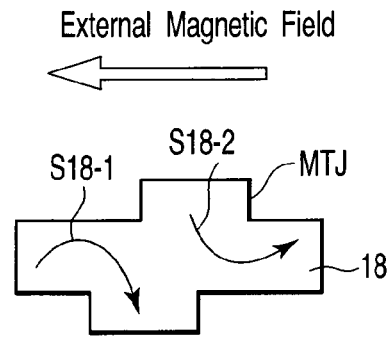
FIG. 23 is a plan view that schematically shows "C" magnetization configuration in the free layer of the magnetic memory device according to Modification 1.

Referring now to FIG. 21 to FIG. 23, the operation of the magnetic memory devices according to Modification 1 is described. As is shown in FIGS. 21 to 23, the presence of any one of the projection portions of the ferromagnetic layer 18 of the MTJ element can cause magnetization $S_{18-1}$, $S_{18-2}$ with "C" type structure.

According to the above-described structure, the same advantages as with the first embodiment can be obtained. Further, with the MTJ elements having the plan-view shapes shown in FIGS. 11 to 20, too, a plurality of "C" magnetization configuration in the free layers can be caused. Therefore, the write operation margin against erroneous write can be increased, and the selectivity of the MTJ element can be enhanced.

[Modification 2 (Cross-Sectional Shape, Cross-Sectional Structure)]

Figure 24:
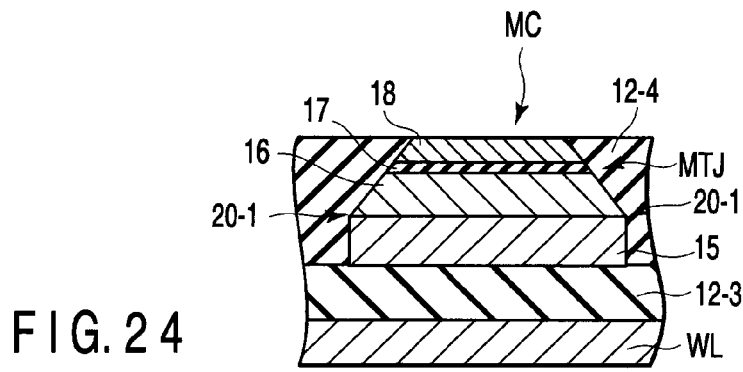
FIG. 24 is a cross-sectional view that schematically shows a magnetic memory device according to Modification 2.
Figure 25:
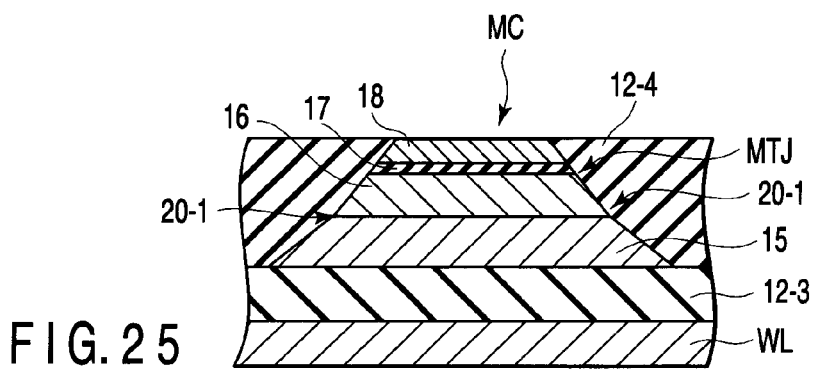
FIG. 25 is a cross-sectional view that schematically shows a magnetic memory device according to Modification 2.
Figure 26:
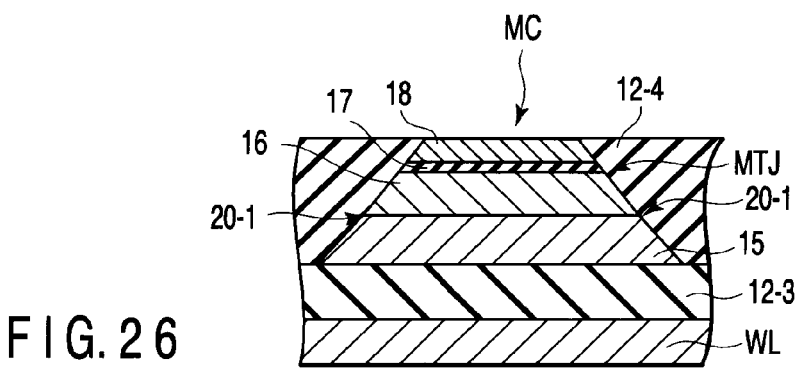
FIG. 26 is a cross-sectional view that schematically shows a magnetic memory device according to Modification 2.

Magnetic memory devices according to Modification 2 of the first embodiment will now be described with reference to FIG. 24 to FIG. 30. A description of the parts, which are common to those in the first embodiment and Modification 1, is omitted. FIGS. 24 to 26 are cross-sectional views that schematically show magnetic memory devices according to Modification 2.

As is shown in FIGS. 24 to 26, the underlying conductive layer 15 and parts 20-1 of the side walls of the MTJ element are formed to be continuous. To be more specific, the MTJ element or the underlying conductive layer 15 is tapered, and the end portions of the MTJ element and underlying conductive layer 15 do not appear to be flush with each other, when viewed from the major surface side (top side) of the semiconductor substrate 11.

In FIG. 24, the MTJ element is tapered, but the underlying conductive layer 15 is not tapered. In FIG. 25, both the MTJ element and underlying conductive layer 15 are tapered, and their taper angles are not equal. In FIG. 26, the MTJ element and underlying conductive layer 15 are tapered with equal angles (i.e. the MTJ element and underlying conductive layer 15 are linearly continuous).

Next, various cross-sectional structures of MTJ elements are described referring to FIG. 27 to FIG. 30.

Figure 27:
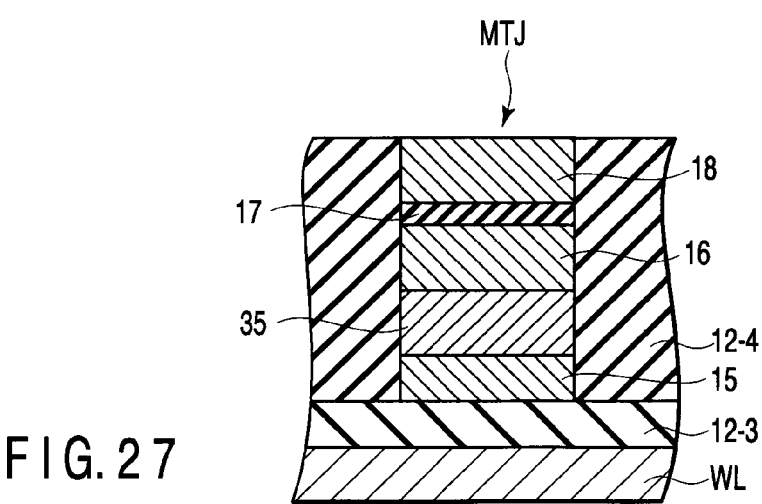
FIG. 27 is a cross-sectional view that schematically shows a magnetic memory device according to Modification 2.

In an MTJ element shown in FIG. 27, an antiferromagnetic layer 35 is provided between the underlying conductive layer 15 and pinned layer (magnetic layer) 16.

Figure 28:
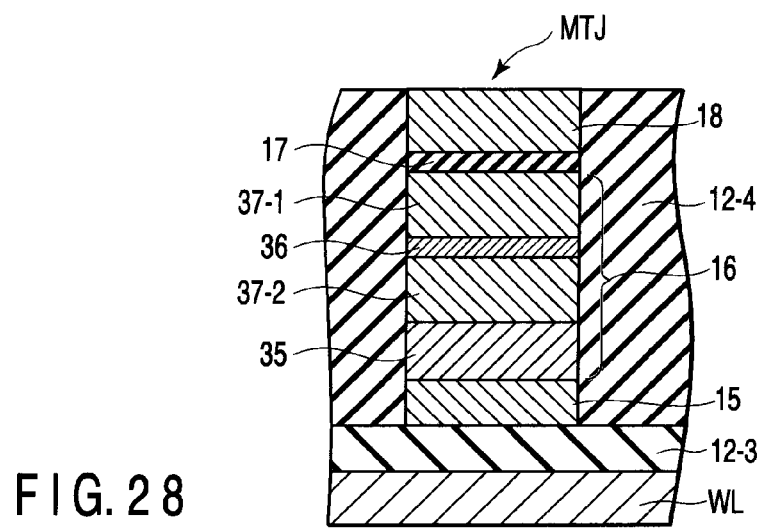
FIG. 28 is a cross-sectional view that schematically shows a magnetic memory device according to Modification 2.

An MTJ element shown in FIG. 28 has a so-called synthetic antiferromagnetic pin structure wherein the pinned layer 16 comprises an antiferromagnetic layer 35, a ferromagnetic film 37-2, a paramagnetic metal layer 36 and a ferromagnetic layer 37-2.

Figure 29:
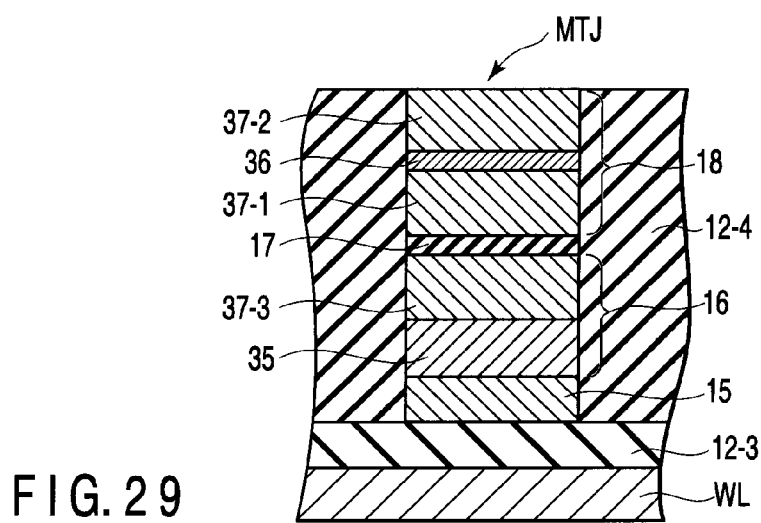
FIG. 29 is a cross-sectional view that schematically shows a magnetic memory device according to Modification 2.

An MTJ element shown in FIG. 29 is configured such that the free layer 18 comprises ferromagnetic layers 37-1 and 37-2 and a paramagnetic metal layer 36, and the paramagnetic metal layer 36 is sandwiched between the ferromagnetic layers 37-1 and 37-2.

Figure 30:
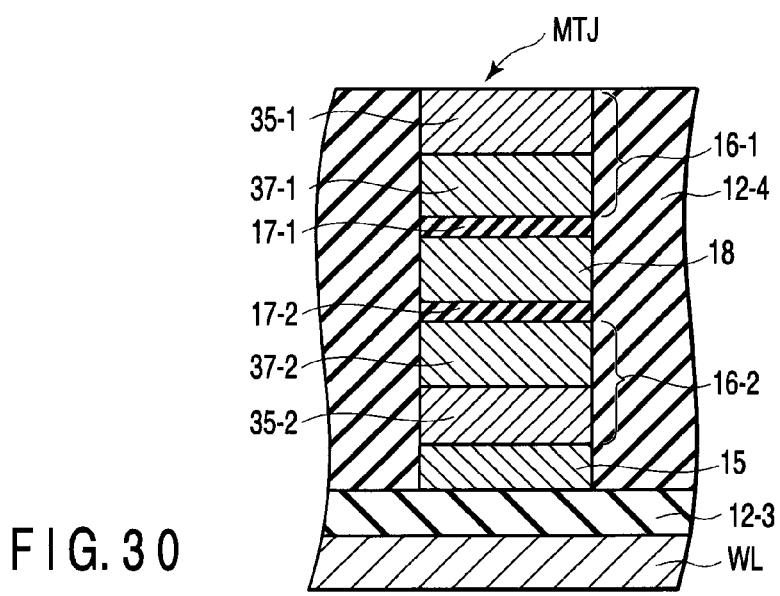
FIG. 30 is a cross-sectional view that schematically shows a magnetic memory device according to Modification 2.

An MTJ element shown in FIG. 30 has a so-called double junction structure wherein two MTJ elements having a common free layer 18 are vertically stacked. Two pinned layers 16-1 and 16-2 and two insulating barrier layers 17-1 and 17-2 are provided. The pinned layer 16-1 comprises a ferromagnetic layer 37-1 and an antiferromagnetic layer 35-1 that is provided on the ferromagnetic layer 37-1. The pinned layer 16-2 comprises an antiferromagnetic layer 35-2 and a ferromagnetic layer 37-2 that is provided on the antiferromagnetic layer 35-2.

Needless to say, combinations of the above-described structures may be adopted.

According to the above-described structures, the same advantages as with the first embodiment can be obtained. Further, since the cross-sectional shapes as shown in FIGS. 24 to 26 can be adopted, the selectivity of MTJ elements is enhanced.

The MTJ element shown in FIG. 28 has the so-called synthetic antiferromagnetic pin structure. Thus, lines of magnetic force are looped at the two ferromagnetic films 37-1 and 37-2 between which the paramagnetic metal layer 36 is sandwiched. Thereby, a stray field to the free layer 18 is suppressed, and deformation of the asteroid curve is prevented.

In the MTJ element shown in FIG. 29, the free layer 18 comprises the ferromagnetic layers 37-1 and 37-2 and paramagnetic metal layer 36, and the paramagnetic metal layer 36 is sandwiched between the ferromagnetic layers 37-1 and 37-2. Accordingly, the lines of magnetic force are looped at the two ferromagnetic films 37-1 and 37-2 between which the paramagnetic metal layer 36 is sandwiched. Thereby, a demagnetizing field can be reduced, and this is effective in miniaturization of the MTJ element.

[Modification 3 (Fabrication Methods)]

Magnetic memory devices according to Modification 3 of the first embodiment will now be described with reference to FIG. 31 to FIG. 38. A description of the parts common to those in the first embodiment is omitted here.

Referring to FIGS. 31 to 34, a description is first given of a method of manufacturing an ordinary MTJ element (rectangular MTJ element) having no projection portion in the hard-axis direction.

To begin with, through similar fabrication steps, an insulation layer 12-1, an insulation layer 12-2, a word line WL and an insulation layer 12-3 are formed on a major surface of the semiconductor substrate 11.

Then, on the insulation layer 12-3, CVD, for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated (not illustrated).

Figure 31:
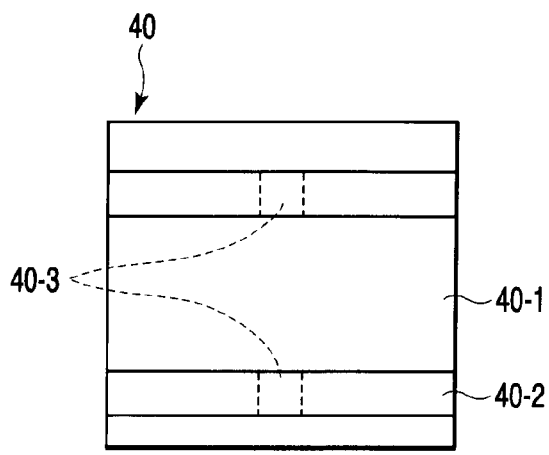
FIG. 31 is a plan view that schematically shows a photomask in a fabrication step of a magnetic memory device according to Modification 3.

Using a photomask (MTJ mask) 40 as shown in FIG. 31, the photoresist is exposed and developed. A pattern 40-2 of the photomask 40 is thus transferred on the photoresist. The photomask 40 has such a stripe pattern 40-2 that arm portions 40-3 of the MTJ element, which are formed in the easy-axis direction, extend to adjacent MTJ elements on a glass mask 40-1. In usual cases, in order to secure flatness of each magnetic layer, the MTJ element is provided not with crystal-axis anisotropy but with shape anisotropy. Thus, the plan-view shape of the MTJ element has a longitudinal-axis direction.

Figure 32:
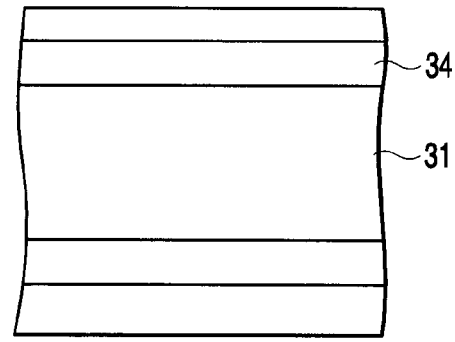
FIG. 32 is a plan view that schematically illustrates a fabrication step of the magnetic memory device according to Modification 3.

As is shown in FIG. 32, using the pattern-transferred photoresist as a mask, anisotropic etching such as RIE is carried out to transfer the pattern 40-2 on the protection film. Further, the photoresist is removed. The protection mask on which the pattern 40-2 is transferred is used as a mask, and anisotropic etching such as RIE is effected down to the surface of the conductive material 31. Thus, the magnetic material 34, insulation material 33 and magnetic material 32 are formed in a stripe shape.

Subsequently, a protection film is deposited on the magnetic material 34 once again, and a photoresist is coated on the protection film (not illustrated).

Figure 33:
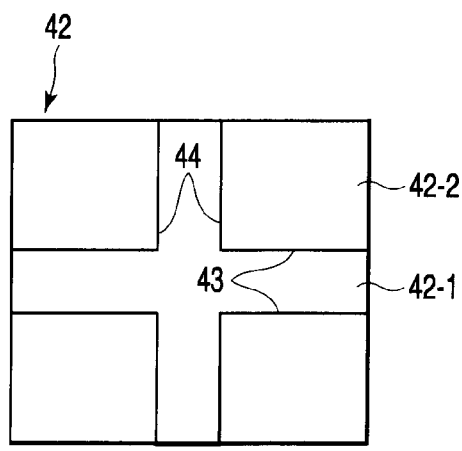
FIG. 33 is a plan view that schematically shows a photomask in a fabrication step of the magnetic memory device according to Modification 3.

Using a photomask (MX mask) 42 as shown in FIG. 33, the photoresist is exposed and developed, and a pattern of the photomask 42-2 is transferred on the photoresist. The photomask 42 is formed such that rectangular patterns 42-2 are provided on a glass mask 42-1. The rectangular patterns 42-2 are configured such that each rectangle has a side 43 corresponding to the easy-axis direction, and a side 44 corresponding to the hard-axis direction.

Figure 34:
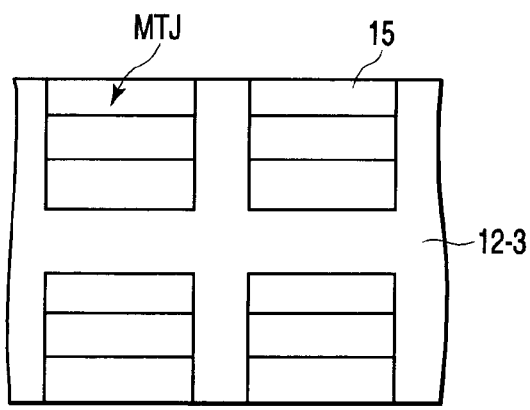
FIG. 34 is a plan view that schematically illustrates a fabrication step of the magnetic memory device according to Modification 3.

Thereafter, as shown in FIG. 34, using the pattern-transferred photoresist as a mask, anisotropic etching such as RIE is carried out to transfer the pattern 42-2 onto the protection film. Further, the photoresist is removed. The protection film, on which the pattern 42-2 is transferred, is used as a mask, and anisotropic etching such as RIE is performed down to the surface of the insulation layer 12-3. Thereby, the layers are separated in the hard-axis/easy-axis directions, and the MTJ elements are formed. At the same time, the conductive layer 31 is separated in association with the individual MTJ elements, and the underlying conductive layer 15 is formed.

Subsequently, well-known fabrication steps are carried out, and an ordinary MTJ element (rectangular MTJ element) having no projection portion in the hard-axis direction is fabricated.

Next, a method of manufacturing an MTJ element, which has no projection portion in the hard-axis direction and has pointed end portions (triangular), is described with reference to FIG. 35 to FIG. 38.

To begin with, through similar fabrication steps, an insulation layer 12-1, an insulation layer 12-2, a word line WL and an insulation layer 12-3 are formed on a major surface of the semiconductor substrate 11.

Then, on the insulation layer 12-3, CVD, for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated (not illustrated).

Figure 35:
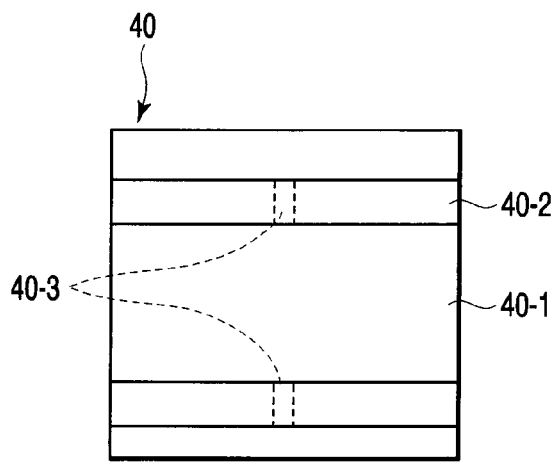
FIG. 35 is a plan view that schematically shows a photomask in a fabrication step of a magnetic memory device according to Modification 3.

Using a photomask (MTJ mask) 40 as shown in FIG. 35, the photoresist is exposed and developed. A pattern 40-2 of the photomask 40 is thus transferred on the photoresist. The photomask 40 has such a stripe pattern 40-2 that arm portions 40-3, which are formed in the easy-axis direction, extend to adjacent MTJ elements on a glass mask 40-1.

Figure 36:
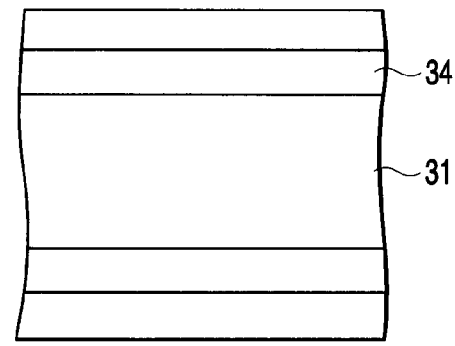
FIG. 36 is a plan view that schematically illustrates a fabrication step of the magnetic memory device according to Modification 3.

As is shown in FIG. 36, using the pattern-transferred photoresist as a mask, anisotropic etching such as RIE is carried out to transfer the pattern 40-2 on the protection film. Further, the photoresist is removed. The protection mask on which the pattern 40-2 is transferred is used as a mask, and anisotropic etching such as RIE is effected down to the surface of the conductive material 31. Thus, the magnetic material 34, insulation material 33 and magnetic material 32 are formed in a stripe shape.

Subsequently, a protection film is deposited on the magnetic material 34 once again, and a photoresist is further coated on the protection film (not illustrated).

Figure 37:
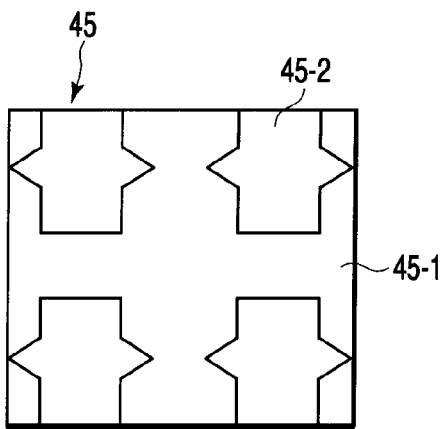
FIG. 37 is a plan view that schematically shows a photomask in a fabrication step of the magnetic memory device according to Modification 3.

Using a photomask (MX mask) 45 as shown in FIG. 37, the photoresist is exposed and developed, and a pattern 45-2 of the photomask 45 is transferred on the photoresist.

Figure 38:
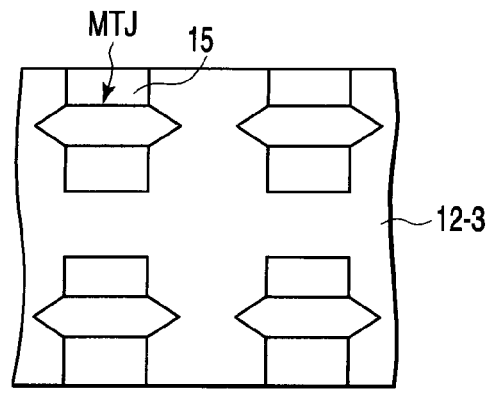
FIG. 38 is a plan view that schematically illustrates a fabrication step of the magnetic memory device according to Modification 3.

Thereafter, as shown in FIG. 38, using the pattern-transferred photoresist as a mask, anisotropic etching such as RIE is carried out to transfer the pattern 45-2 onto the protection film. Further, the photoresist is removed. The protection film, on which the pattern is transferred, is used as a mask, and anisotropic etching such as RIE is performed down to the surface of the insulation layer 12-3. Thereby, the magnetic layer 32, conductive layer 33 and magnetic layer 34 are separated in the hard-axis direction, and the MTJ elements are formed. At the same time, the conductive layer 31 is separated in association with the individual MTJ elements, and the underlying conductive layer 15 is formed.

Subsequently, well-known fabrication steps are carried out, and an MTJ element, which has no projection portion in the hard-axis direction and has pointed end portions (triangular), is fabricated.

This MTJ element has such a plan-view shape that an angular portion (including a rounded portion) is provided at each of both ends in the easy-axis direction, taking into account a case where an angular portion at the end in the easy-axis direction is somewhat rounded in an actual fabrication step. Thus, no hard-axis edge domain occurs at the angular portion, and the reliability in switching can be enhanced.

Next, a method of manufacturing an MTJ element, which has one projection portion in the hard-axis direction (T-shape), is described with reference to FIG. 39 to FIG. 42.

To start with, through similar fabrication steps, an insulation layer 12-1, an insulation layer 12-2, a word line WL and an insulation layer 12-3 are formed on a major surface of the semiconductor substrate 11.

Then, on the insulation layer 12-3, CVD, for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated on the protection film (not illustrated).

Figure 39:
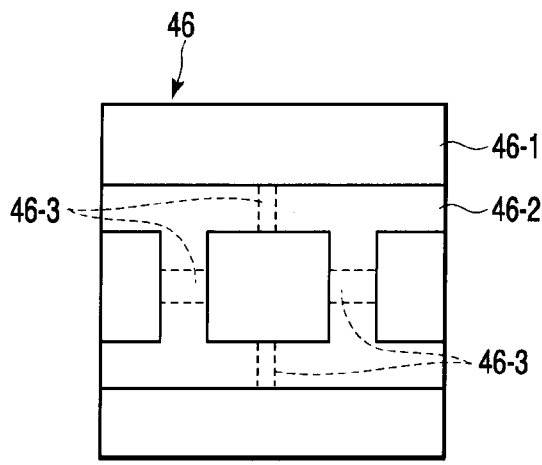
FIG. 39 is a plan view that schematically shows a photomask in a fabrication step of a magnetic memory device according to Modification 3.

Using a photomask (MTJ mask) 46 as shown in FIG. 39, the photoresist is exposed and developed. A pattern 46-2 of the photomask 46 is thus transferred on the photoresist. The photomask 46 has such a pattern 46-2 that arm portions 46-3, which are formed in the easy-axis direction and hard-axis direction, extend to adjacent MTJ elements on a glass mask 46-1.

Figure 40:
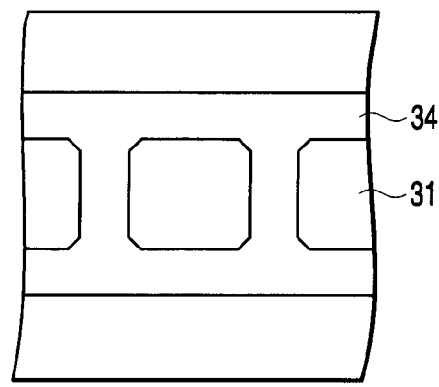
FIG. 40 is a plan view that schematically illustrates a fabrication step of the magnetic memory device according to Modification 3.

As is shown in FIG. 40, using the pattern-transferred photoresist as a mask, anisotropic etching such as RIE is carried out to transfer the pattern 46-2 on the protection film. Further, the photoresist is removed. The protection mask on which the pattern 46-2 is transferred is used as a mask, and anisotropic etching such as RIE is effected down to the surface of the conductive material 31. Thus, the magnetic material 34, insulation material 33 and magnetic material 32 are patterned.

Subsequently, a protection film is deposited on the magnetic material 34 once again, and a photoresist is further coated on the protection film (not illustrated).

Figure 41:
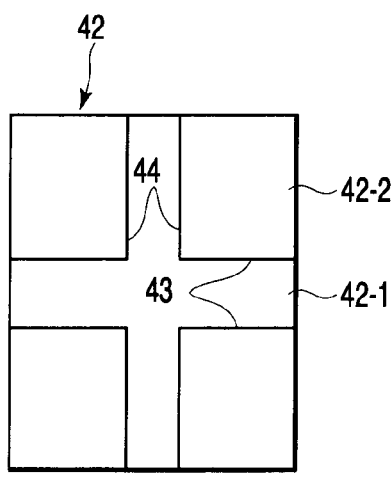
FIG. 41 is a plan view that schematically shows a photomask in a fabrication step of the magnetic memory device according to Modification 3.

Using a photomask (MX mask) 42 as shown in FIG. 41, the photoresist is exposed and developed, and a pattern 42-2 of the photomask 42 is transferred on the photoresist. The photomask 42 is provided with patterns 42-2, each having a side 43 corresponding to the easy-axis direction, and a side 44 corresponding to the hard-axis direction.

Figure 42:
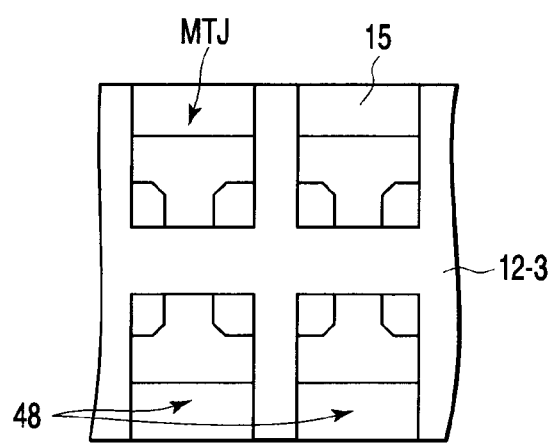
FIG. 42 is a plan view that schematically illustrates a fabrication step of the magnetic memory device according to Modification 3.

Thereafter, as shown in FIG. 42, using the pattern-transferred photoresist as a mask, anisotropic etching such as RIE is carried out to transfer the pattern 42-2 onto the protection film. Further, the photoresist is removed. The protection film, on which the pattern 42-2 is transferred, is used as a mask, and anisotropic etching such as RIE is performed down to the surface of the insulation layer 12-3. Thereby, the magnetic layer 32, conductive layer 33 and magnetic layer 34 are separated in the hard-axis direction, and the MTJ elements are formed. At the same time, the conductive layer 31 is separated in association with the individual MTJ elements, and the underlying conductive layer 15 is formed.

Subsequently, well-known fabrication steps are carried out, and an MTJ element, which has one projection portion in the hard-axis direction (T-shape), is fabricated.

This MTJ element, which has one projection portion in the hard-axis direction (T-shape), is provided with a region 48 that extends in the hard-axis direction on the underlying conductive layer 15, as shown in FIG. 42. Thus, one end of, e.g. a MOS transistor may be connected to the region 48, and this configuration is applicable to a 1T1MTJ element that is described below.

Second Embodiment

1T1MTJ Architecture

In the preceding descriptions, the presence/absence of a select switch has not explicitly been mentioned. Referring now to FIG. 43 to FIG. 52, a description is given of an example of a magnetic memory device wherein a select switch is connected to an MTJ element ("1T1MTJ architecture") and a method of manufacturing the same.

Figure 43:
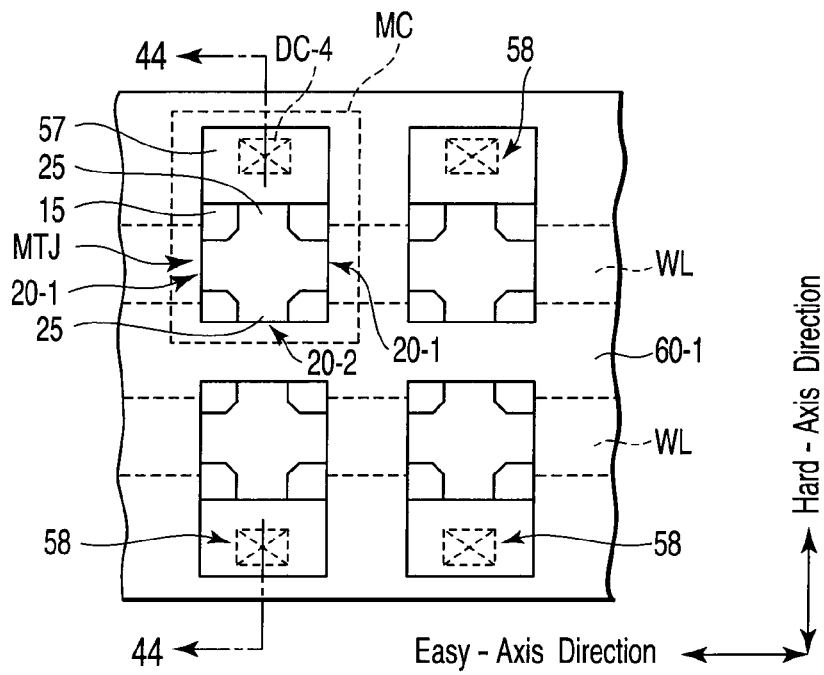
FIG. 43 is a plan view that schematically shows a magnetic memory device according to a second embodiment of the present invention.
Figure 44:
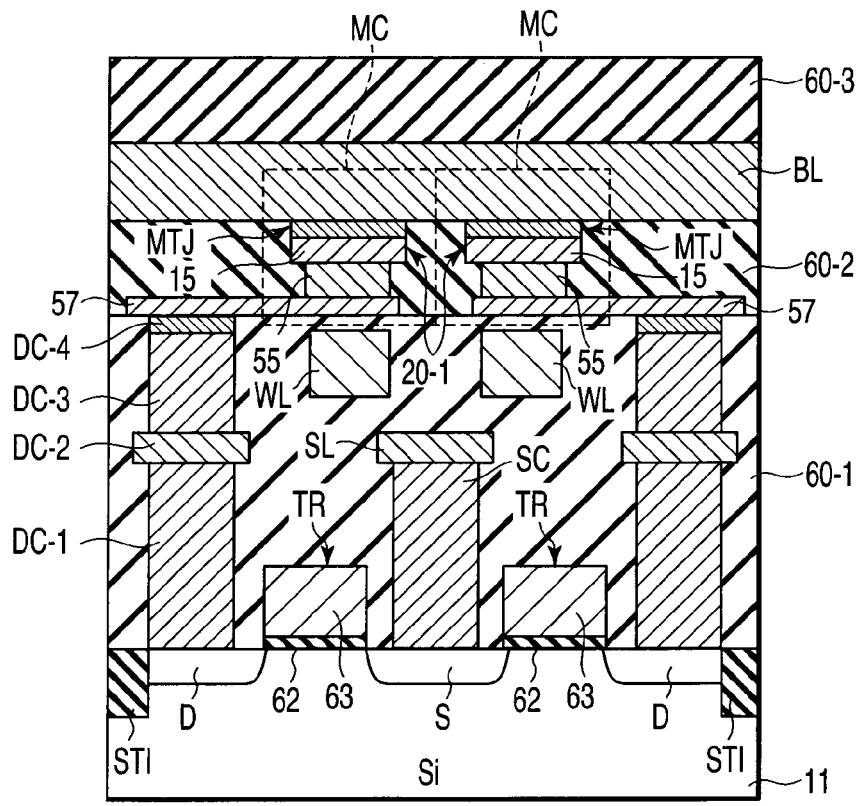
FIG. 44 is a cross-sectional view taken along line 44-44 in FIG. 43.

FIG. 43 is a plan view that schematically shows a magnetic memory device according to a second embodiment of the invention. FIG. 44 is a cross-sectional view taken along line 44-44 in FIG. 43.

In a case where a MOS transistor, a bipolar transistor or a diode is used as the select switch, such a device is provided on a semiconductor (silicon) substrate 11 if importance is placed on cut-off characteristics of the select switch.

The MTJ element is provided at an intersection between upper and lower write lines (word line WL and bit line BL). In this case, it is necessary to put the underlying conductive layer 15 in contact with one end (e.g. diffusion layer) of the select switch provided on the semiconductor substrate, using such a connection path that the lower write line (word line WL), in particular, is avoided and detoured. For this purpose, a contact 55 is provided on a second underlying conductive layer 57, and a first underlying conductive layer 15 is provided on the contact 55. The MTJ element is provided on the first underlying conductive layer 15. The second underlying conductive layer 57 extends from the intersection between the bit line BL and word line WL in the same direction as the bit line BL. The second underlying conductive layer 57 is provided with a region 58 for electrical connection between the transistor TR and the bit line BL.

A transistor (select transistor) TR for selecting the MTJ element is provided in an insulation layer 60-1 that is formed on the major surface of the semiconductor substrate (Si substrate) 11. The MTJ (Magnetic Tunnel Junction) element (magneto-resistance effect element) is provided in an insulation layer 60-2 at the intersection between the bit line BL (write line) and the word line WL (write line) (depiction of the bit line BL is omitted in FIG. 43). An insulation layer 60-3 is provided on the bit line BL. A region indicated by a broken line in FIG. 44 designates a 1-bit memory cell MC.

The transistor TR comprises a gate electrode 63, which is provided on the major surface of the substrate 11 with a gate insulation film 62 interposed, and a source S and a drain D, which are provided in the substrate 11 so as to sandwich the gate electrode 63. A source line contact SC is provided on the source S. A source line SL, which applies a common potential to sources S that are provided along the word line WL, is provided on the source line contact SC. Drain contacts DC-1 to DC-4, which are electrically connected to an end of the MTJ element, are provided on the drain D.

The memory cell MC comprises the contact 55 provided on the second underlying conductive layer 57; the first underlying conductive layer 15 provided on the contact 55; and the MTJ element provided on the first underlying conductive layer 15. As mentioned above, the second underlying conductive layer 57 is formed to extend in the same direction as the bit line BL from the intersection between the bit line BL and word line WL, and the second underlying conductive layer 57 is provided with the region 58 for electrical connection between the transistor TR and the bit line BL.

The first underlying conductive layer 15 and the parts 20-1 of side walls of the MTJ element in the hard-axis direction are formed to be continuous. In addition, the first underlying conductive layer 15 and the parts 20-2 of side walls of the MTJ element in the easy-axis direction are formed to be continuous. In other words, the end portions of the first underlying conductive layer 15 in the easy-axis direction and hard-axis direction do not project from the end portions of the MTJ element in the easy-axis direction or the hard-axis direction.

Therefore, the cell area can be minimized while the drain D of the transistor TR is electrically connected to the MTJ element. This is effective in miniaturization.

A method of manufacturing the magnetic memory device according to this embodiment will now be described with reference to FIG. 45 to FIG. 52, taking the MRAM shown in FIG. 43 or 44 by way of example.

Through well-known fabrication steps, a transistor TR, a source line contact SC, a source line SL and drain contacts DC-1 to DC-4 are formed in an insulation layer 60-1 on the major surface of the semiconductor substrate 11.

A conductive material that becomes a second underlying conductive layer 57 is deposited on the insulation layer 60-1 by means of, e.g. CVD (not illustrated).

A photoresist is coated on the conductive material (not shown).

Figure 45:
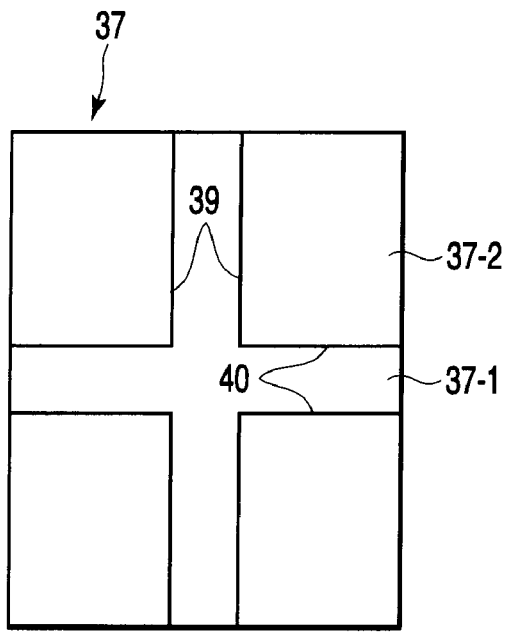
FIG. 45 is a plan view that schematically shows a photomask in a fabrication step of the magnetic memory device according to the second embodiment.

The photoresist is exposed and developed, using a photomask (MX1 mask) 37 shown in FIG. 45. A pattern 37-2 of the photomask 37 is thus transferred on the photoresist. The photomask 37 is formed such that rectangular patterns 37-2 are provided on a glass mask 37-1. The rectangular patterns 37-2 are configured such that rectangles are arranged in a matrix, each rectangle having a long side 39 corresponding to the hard-axis direction, and a short side 40 corresponding to the easy-axis direction.

Figure 46:
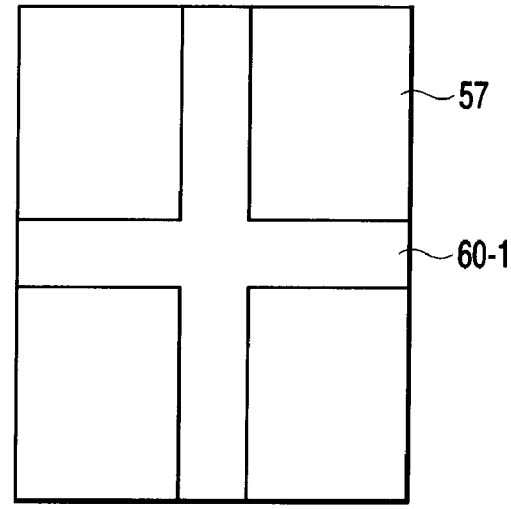
FIG. 46 is a plan view that schematically illustrates a fabrication step of the magnetic memory device according to the second embodiment.

As is shown in FIG. 46, using the pattern-transferred photoresist as a mask, anisotropic etching such as RIE is effected down to the surface of the insulation layer 60-1, and the second underlying conductive layer 57 is formed in a matrix shape.

An insulation layer is deposited on the second underlying conductive layer 57 (not illustrated). A photoresist is further coated on the conductive material (not illustrated).

Figure 47:
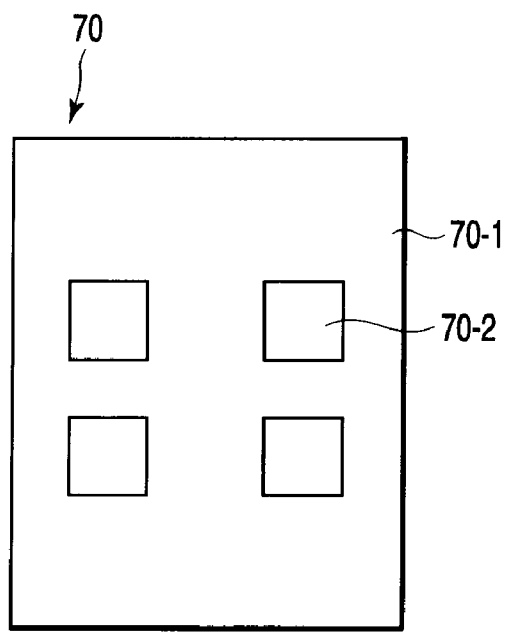
FIG. 47 is a plan view that schematically shows a photomask in a fabrication step of the magnetic memory device according to the second embodiment.

Using a photomask (VX mask) 70 shown in FIG. 47, the photoresist is exposed and developed, and a pattern 70-2 of the photomask 70 is transferred on the photoresist. The photomask 70 is configured such that the pattern 70-2 for forming contacts 55 is provided on a glass mask 70-1.

Figure 48:
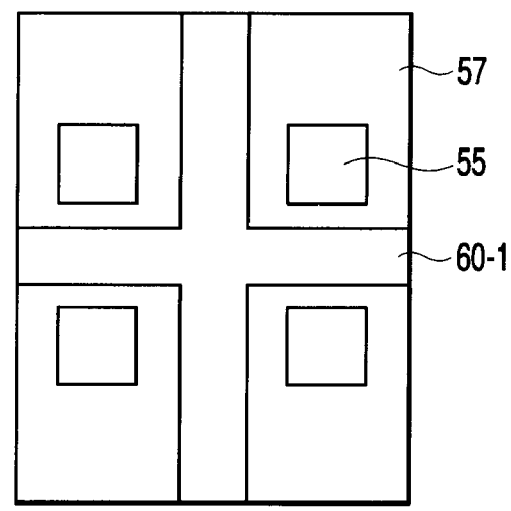
FIG. 48 is a plan view that schematically illustrates a fabrication step of the magnetic memory device according to the second embodiment.

Then, as shown in FIG. 48, the photoresist on which the pattern 70-2 is transferred is used as a mask, and anisotropic etching such as RIE is conducted down to the surface of the second underlying conductive layer 57. Thus, the insulation film is etched down to the surface of the second underlying conductive layer, and the contact holes 55 are formed.

A conductive material 31 that becomes the first underlying conductive layer 15 is formed on the contact 55 and the insulation layer. An MTJ material 75 that becomes the MTJ element is formed on the conductive material 31 (not illustrated). Further, a protection film is deposited on the MTJ material 75, following which a photoresist is coated (not shown).

Figures 49, 50:
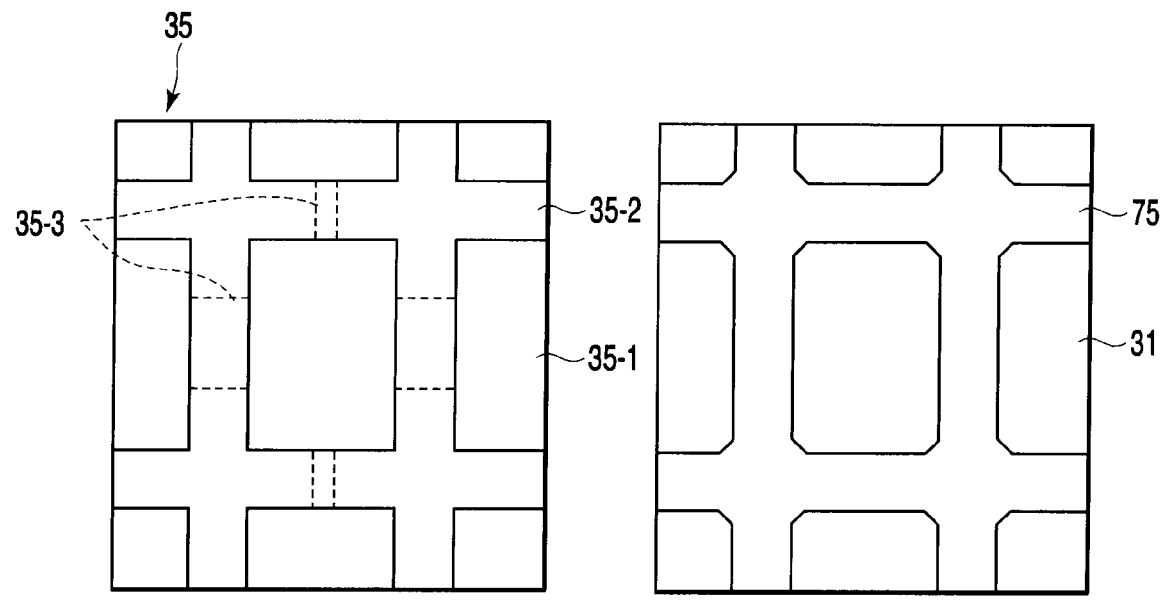
FIG. 49 is a plan view that schematically shows a photomask in a fabrication step of the magnetic memory device according to the second embodiment.
FIG. 50 is a plan view that schematically illustrates a fabrication step of the magnetic memory device according to the second embodiment.

Subsequently, using a photomask (MTJ mask) 35 as shown in FIG. 49, the photoresist is exposed and developed, thereby transferring a pattern 35-2 of the photomask 35 onto the photoresist.

As is shown in FIG. 50, using the pattern-transferred photoresist as a mask, anisotropic etching such as RIE is conducted, and the pattern 35-2 is transferred on the protection film. Further, the photoresist is removed. The protection mask on which the pattern 35-2 is transferred is used as a mask, and anisotropic etching such as RIE is effected down to the surface of the conductive material 31. Thus, the MTJ material 75 is formed in a grid shape.

A protection film is deposited on the MTJ material 75 and the conductive material 31, and a photoresist is coated on the protection film (not illustrated).

Figures 51, 52:
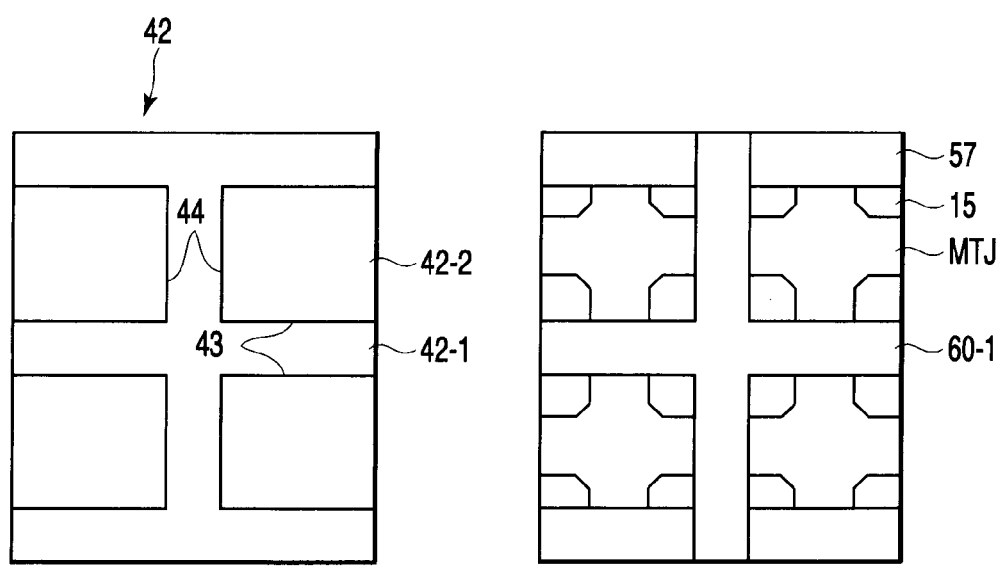
FIG. 51 is a plan view that schematically shows a photomask in a fabrication step of the magnetic memory device according to the second embodiment.
FIG. 52 is a plan view that schematically illustrates a fabrication step of the magnetic memory device according to the second embodiment.

Using a photomask (MX mask) 42 as shown in FIG. 51, the photoresist is exposed and developed, and a pattern 42-2 of the photomask 42 is transferred on the photoresist.

As is shown in FIG. 52, using the pattern-transferred photoresist as a mask, anisotropic etching such as RIE is conducted, thereby transferring the pattern 42-2 on the protection film. Further, the photoresist is removed, and the protection film, on which the pattern 42-2 is transferred, is used as a mask to perform anisotropic etching, such as RIE, down to the surface of the second underlying conductive layer 57. Thereby, the MTJ material 75 is separated and MTJ elements are formed. At the same time, the conductive layer 31 is separated in association with the individual MTJ elements, and the underlying conductive layer 15 is formed.

Subsequently, well-known fabrication steps are carried out, and the magnetic memory device shown in FIG. 43 or FIG. 44 is manufactured.

According to the above-described manufacturing method, the same advantages as with the manufacturing method of the magnetic memory device of the first embodiment can be obtained. Further, according to the manufacturing method of this embodiment, the end portions 20-1 of the second underlying conductive layer on the MTJ element in the easy-axis direction are formed to be substantially flush with the end portions of the MTJ element in the easy-axis direction. The end portions 20-1 do not project from the MTJ element in the easy-axis direction. On the other hand, one of the end portions 20-2 of the second underlying conductive layer on the MTJ element in the hard-axis direction are formed to be substantially flush with the associated end portion of the MTJ element in the hard-axis direction. The other end portion 20-2 in the hard-axis direction is formed to project from the MTJ element in the hard-axis direction.

Therefore, it is possible to form the second underlying conductive layer 57 that can minimize the cell area while electrically connecting the drain D of the transistor TR to the end of the MTJ element. This is effective in miniaturization.

[Modification 4 (1T1MTJ Architecture)]

A magnetic memory device according to Modification 4 of the second embodiment and a method of manufacturing the same will now be described referring to FIG. 53 to FIG. 57. A description of the parts common to those in the first and second embodiments and Modifications 1 to 3 is omitted here.

Figure 53:
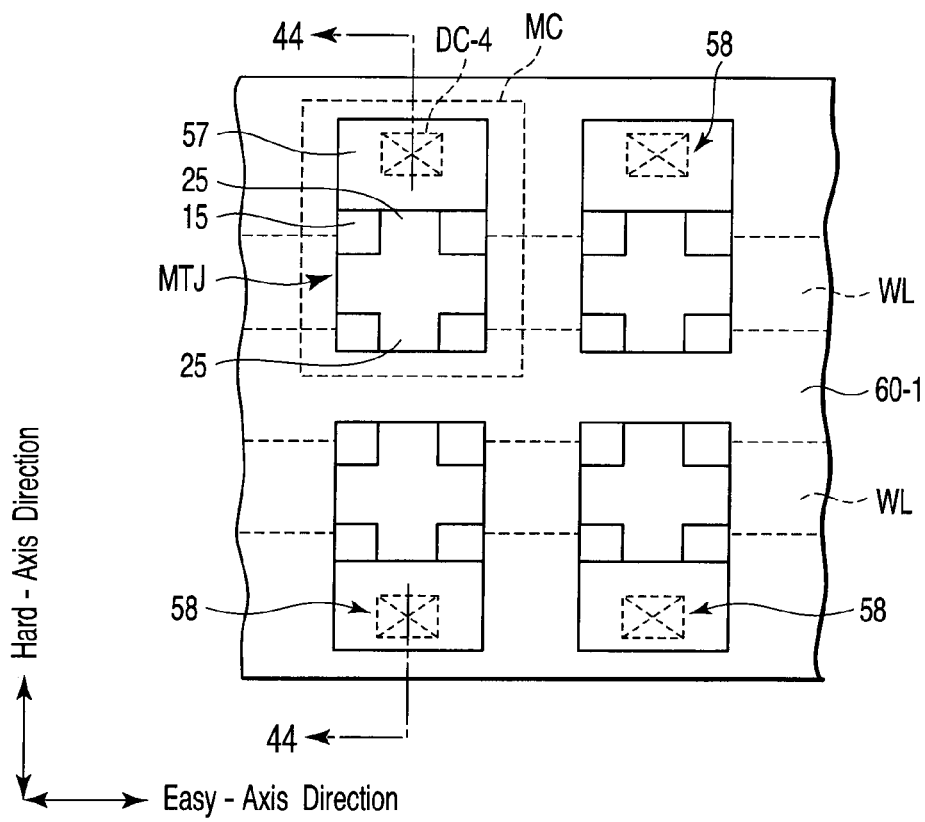
FIG. 53 is a plan view that schematically shows a magnetic memory device according to Modification 4.

FIG. 53 is a plan view that schematically shows the magnetic memory device according to Modification 4. A cross-sectional view taken along line 44-44 in FIG. 53 is the same as FIG. 44. The magnetic memory device according to Modification 4 is a so-called 1T1MTJ type magnetic memory device, and this is an example of an MTJ element having a sharper cruciform shape.

As is shown in FIG. 53, each MTJ element has a pair of symmetric projection portions 25 in the hard-axis direction, and each MTJ element has a cruciform plan-view shape. The projection portion 25 intersects substantially at right angles with the MTJ element that extends in the easy-axis direction. Thus, the MTJ element has a sharper cruciform shape.

According to this structure, the same advantages as with the second embodiment can be obtained. Moreover, since the projection portion 25 intersects substantially at right angles with the MTJ element that extends in the easy-axis direction, the MTJ element has a sharper cruciform shape.

Hence, the hysteresis curve according to Modification 4 can be made to have a more isotropic shape, that is, an inwardly "recessed" shape. Therefore, an erroneous write margin can be increased, and write current can be reduced.

A method of manufacturing the magnetic memory device according to Modification 4 will now be described with reference to FIG. 54 to FIG. 57, taking the MRAM shown in FIG. 53 by way of example.

Through fabrication steps similar to those in the second embodiment, a transistor TR, a source line contact SC, a source line SL, drain contacts DC-1 to DC-4, a second underlying conductive layer 57 and a contact 55 are formed in an insulation layer 60-1 on the major surface of the semiconductor substrate 11 (not illustrated).

A conductive material 31 that becomes a first underlying conductive layer 15, a stacked MTJ material 85 that becomes an MTJ element, and a protection film are successively deposited on the contact 55, second underlying conductive layer 57 and insulation layer 60-1 by means of, e.g. CVD (not illustrated). Further, a photoresist is coated on the protection film.

Figures 54, 55:
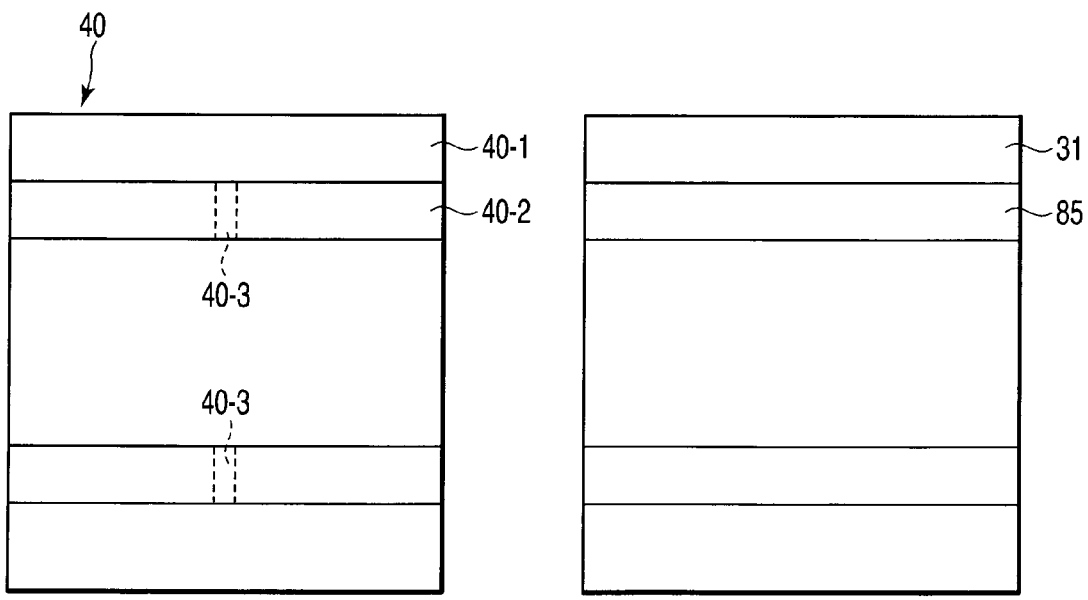
FIG. 54 is a plan view that schematically shows a photomask in a fabrication step of the magnetic memory device according to Modification 4.
FIG. 55 is a plan view that schematically illustrates a fabrication step of the magnetic memory device according to Modification 4.

The photoresist is exposed and developed, using a photomask (MTJ1 mask) 40 shown in FIG. 54. A pattern 40-2 of the photomask 40 is thus transferred on the photoresist. The photomask 40 has such a stripe pattern 40-2 that arm portions 40-3, which are formed in the easy-axis direction, extend to adjacent MTJ elements on a glass mask 40-1.

As is shown in FIG. 55, using the photoresist, on which the pattern 40-2 is transferred, as a mask, anisotropic etching such as RIE is carried out to transfer the pattern 40-2 on the protection film. Further, the photoresist is removed. The protection mask on which the pattern 40-2 is transferred is used as a mask, and anisotropic etching such as RIE is effected down to the surface of the conductive material 31. Thus, only the MTJ material 85 in the easy-axis direction is formed in a stripe shape.

Subsequently, a protection film is deposited on the MTJ material 85 and the conductive material 31, and a photoresist is coated on the protection film (not illustrated).

Figures 56, 57:
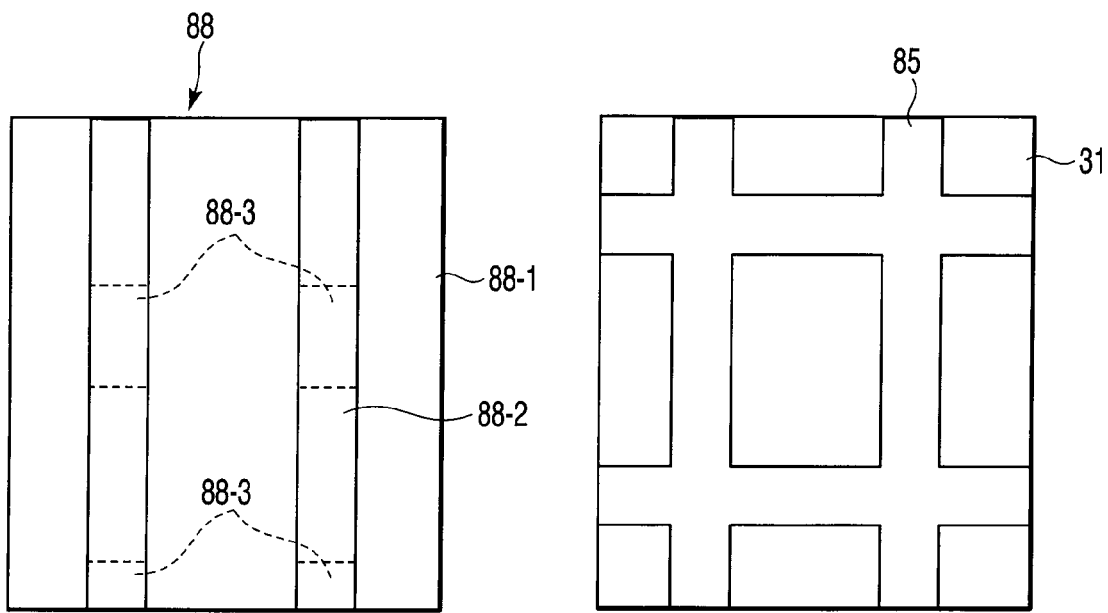
FIG. 56 is a plan view that schematically shows a photomask in a fabrication step of the magnetic memory device according to Modification 4.
FIG. 57 is a plan view that schematically illustrates a fabrication step of the magnetic memory device according to Modification 4.

Using a photomask (MTJ2 mask) 88 as shown in FIG. 56, the photoresist is exposed and developed, and a pattern 88-2 of the photomask 88 is transferred on the photoresist. The photomask 88 has such a pattern 88-2 with a striped plan-view shape that arm portions 88-3, which are formed in the hard-axis direction, extend to adjacent MTJ elements on a glass mask 88-1.

Using the pattern-transferred photoresist as a mask, anisotropic etching such as RIE is carried out to transfer the pattern 88-2 on the protection film. Further, as shown in FIG. 57, the photoresist is removed. The protection mask on which the pattern 88-2 is transferred is used as a mask, and anisotropic etching such as RIE is effected down to the surface of the conductive material 31. Thus, the MTJ material 85 is formed in such a shape that MTJ elements in the easy-axis direction/hard-axis direction are connected.

Subsequently, through similar steps, the magnetic memory device shown in FIG. 53 is fabricated.

According to the above-described manufacturing method, the same advantages as with the manufacturing method of the magnetic memory device of the second embodiment can be obtained. Further, in the manufacturing method according to Modification 4, MTJ elements in the easy-axis direction and hard-axis direction are independently formed using two photomasks (MTJ1 mask 80 and MTJ2 mask 88). Thus, the MTJ element with a sharper cruciform plan-view shape can be formed. As a result, the erroneous write margin can be increased, the write current reduced, and the reliability enhanced.

[Modification 5 (1T1MTJ Architecture)]

A magnetic memory device according to Modification 5 of the second embodiment and a method of manufacturing the same will now be described referring to FIG. 58 to FIG. 64. A description of the parts common to those in the first and second embodiments and Modifications 1 to 4 is omitted here.

Figure 58:
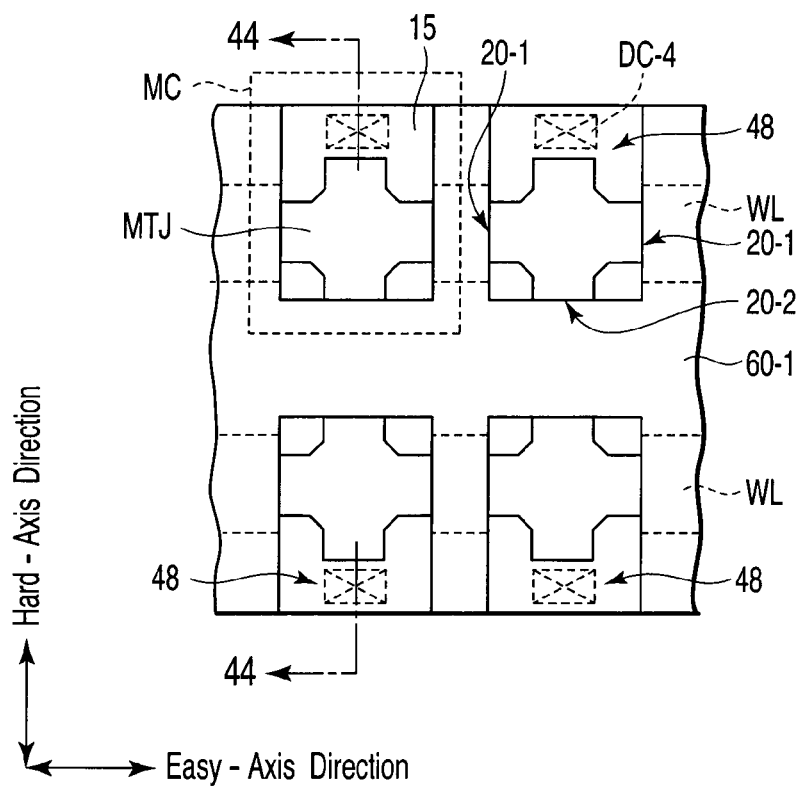
FIG. 58 is a plan view that schematically shows a magnetic memory device according to Modification 5.

FIG. 58 is a plan view that schematically shows the magnetic memory device according to Modification 5. In the magnetic memory device according to Modification 5, a region 48 extending in the hard-axis direction is provided on the underlying conductive layer 15. One end of the select switch, such as a MOS transistor, and the MTJ element are put in contact with each other via the drain contact DC-4 provided at the region 48. A cross-sectional view taken along line 44-44 in FIG. 58 is the same as FIG. 44, except that the contact 55 and second underlying conductive layer 57 are not provided.

A method of manufacturing the magnetic memory device according to Modification 5 will now be described with reference to FIG. 59 to FIG. 64, taking the MRAM shown in FIG. 58 by way of example.

Through fabrication steps similar to those described above, a transistor TR, a source line contact SC, a source line SL, and drain contacts DC-1 to DC-4 are formed in an insulation layer 60-1 on the major surface of the semiconductor substrate 11 (not illustrated).

On the insulation layer 60-1, CVD, for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated (not illustrated).

Using a photomask (MTJ mask) 35 as shown in FIG. 59, the photoresist is exposed and developed. A pattern 35-2 of the photomask 35 is thus transferred on the photoresist.

Then, as shown in FIG. 60, using the pattern-transferred photoresist as a mask, anisotropic etching such as RIE is conducted and the pattern 35-2 is transferred on the protection film. Further, the photoresist is removed. The protection mask on which the pattern 35-2 is transferred is used as a mask, and anisotropic etching such as RIE is effected down to the surface of the conductive material 31. Thus, the magnetic material 34, insulation material 33 and magnetic material 32 are formed in a grid shape.

Subsequently, a protection film is deposited on the magnetic material 34 once again, and a photoresist is coated on the protection film (not illustrated).

Using a photomask (separation mask) 50 as shown in FIG. 61, the photoresist is exposed and developed, and a pattern 50-2 of the photomask 50 is transferred on the photoresist. The photomask 50 is configured such that a stripe pattern 50-2 extending in the easy-axis direction is provided on a glass mask 50-1.

As is shown in FIG. 62, using the pattern-transferred photoresist as a mask, anisotropic etching such as RIE is carried out to transfer the pattern 50-2 on the protection film. Further, the photoresist is removed. The protection mask on which the pattern 50-2 is transferred is used as a mask, and anisotropic etching such as RIE is effected down to the surface of the conductive material 31. Thus, parts of the magnetic material 32, an insulative material 33 and magnetic layer 34 are separated in the easy-axis direction.

Subsequently, a protection film is deposited on the magnetic material 34 once again, and a photoresist is coated on the protection film (not illustrated).

Figures 63, 64:
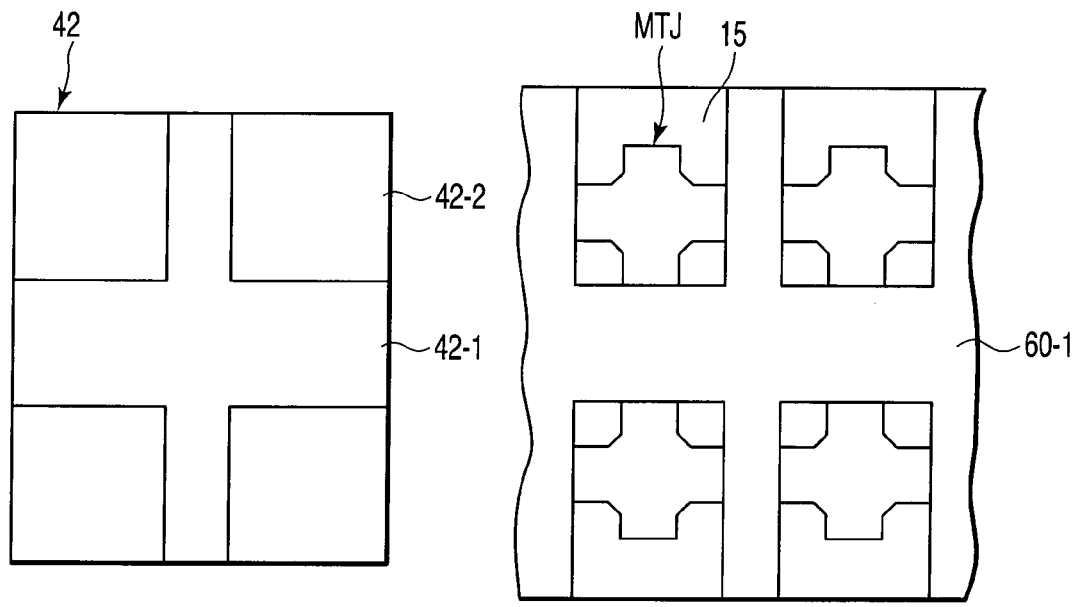
FIG. 63 is a plan view that schematically shows a photomask in a fabrication step of the magnetic memory device according to Modification 5.
FIG. 64 is a plan view that schematically illustrates a fabrication step of the magnetic memory device according to Modification 5.

Using a photomask (MX mask) 42 as shown in FIG. 63, the photoresist is exposed and developed, and a pattern 42-2 of the photomask 42 is transferred on the photoresist.

As is shown in FIG. 64, using the pattern-transferred photoresist as a mask, anisotropic etching such as RIE is carried out to transfer the pattern 42-2 on the protection film. Further, the photoresist is removed. The protection mask on which the pattern 42-2 is transferred is used as a mask, and anisotropic etching such as RIE is effected down to the surface of the insulation layer 60-1. Thus, the magnetic material 32, an insulative material 33 and magnetic layer 34 are separated in units of each MTJ element. Thus, MTJ elements are formed. At the same time, the conductive layer 31 is separated in association with the individual MTJ elements, and the underlying conductive layer 15 is formed.

Subsequently, through well-known fabrication steps, the MTJ element with the cruciform shape is manufactured.

According to the above-described method, the same advantages as with the first embodiment can be obtained. Further, using the photomask (separation mask) 50 shown in FIG. 45, the pattern 50-2 of the photomask 50 is transferred on the photoresist. The photomask 50 is configured such that the stripe pattern 50-2 extending in the easy-axis direction is provided on the glass mask 50-1.

Thus, the cruciform MTJ element, which is not asymmetric in the easy-axis direction or hard-axis direction, can be provided in the cell to which the select switch is connected. This Modification is applicable not only to the cruciform MTJ element, but also to a planar MTJ element having central projections extending in both directions.

[Modification 6]

A magnetic memory device according to Modification 6 of the first embodiment and a method of manufacturing the same will now be described referring to FIG. 65 to FIG. 69. A description of the parts common to those in the first and second embodiments and Modifications 1 to 5 is omitted here.

Figure 65:
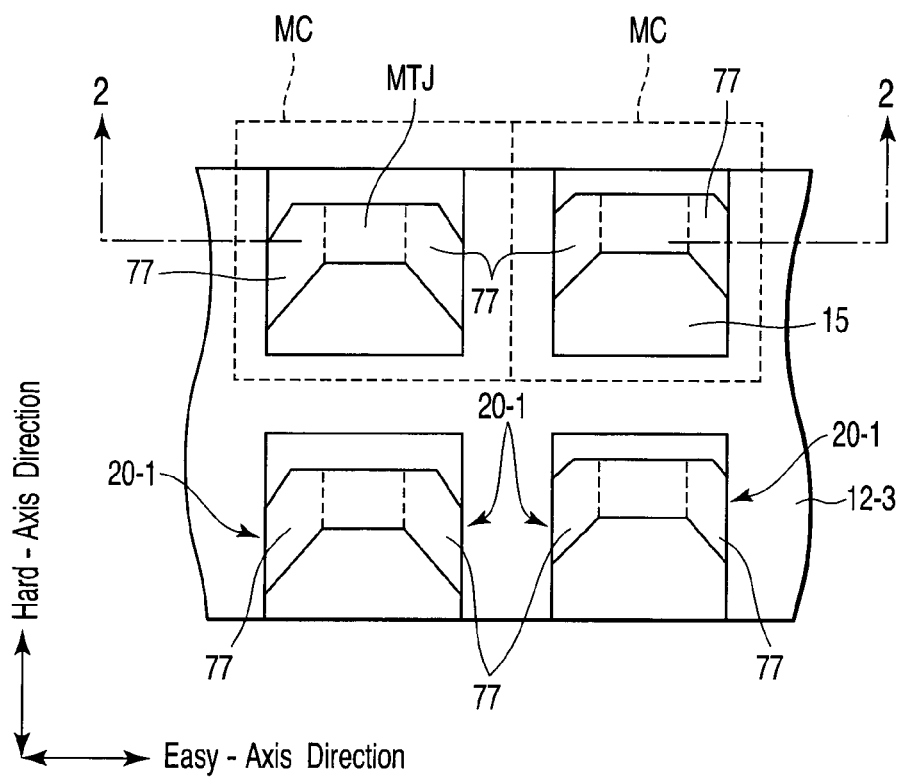
FIG. 65 is a plan view that schematically shows a magnetic memory device according to Modification 6.

FIG. 65 is a plan view that schematically shows the magnetic memory device according to Modification 6. The magnetic memory device according to Modification 6 includes an MTJ element having such a plan-view shape that deflected regions 77, which are deflected in the hard-axis direction, are provided at both ends of a rectangular MTJ element that is provided in the easy-axis direction. A cross-sectional view taken along line 2-2 is the same as FIG. 2.

According to this structure, the same advantages as with the first embodiment can be obtained. Further, the magnetic memory device according to Modification 6 includes an MTJ element having such a plan-view shape that deflected regions 77, which are deflected in the hard-axis direction, are provided at both ends of a rectangular MTJ element that is provided in the easy-axis direction.

The presence of the deflected regions 77 can produce the above-mentioned "C" magnetization configuration in the free layer. To be more specific, after a write operation, the deflected regions 77 have a remanent magnetization state of "C" structure.

In the case where an external magnetic field is generated by letting a current flow only in the bit line BL that is disposed in the hard-axis direction, a reverse field increases due to the "C" structure magnetization. The same applies to the case where only a hard-axis field is generated by causing a current to flow in the word line WL alone. In the case of magnetization reversal due to a composite field of a hard-axis field and an easy-axis field, the plan-view shape with no projection portion causes magnetization reversal substantially with a single-domain structure whereas the plan-view shape with the projection portion causes magnetization reversal with a multi-domain structure. In the multi-domain structure, the volume of each domain is less than that of the single-domain structure, and hence the reverse field decreases. By virtue of this advantage, in the case of the composite field of the hard-axis field and easy-axis field, magnetization reversal (switching) can be caused with a less magnetic field. In the case of the hard-axis field alone or the easy-axis field alone, a greater magnetic field is needed to cause magnetization reversal (switching). Hence, the asteroid curve can be "recessed" inward (toward the origin O).

Thus, the switching magnetic field, that is, the write current and power consumption, can be reduced. Consequently, the asteroid curve is recessed inward, the write current can be reduced, and the write operation margin for erroneous write can be increased. Thus, the selectivity of MTJ elements can be enhanced.

Next, a method of manufacturing the magnetic memory device according to Modification 6 is described referring to FIG. 66 to FIG. 69, taking the MRAM shown in FIG. 65 by way of example.

Through well-known fabrication steps, an insulation layer 12-1, an insulation layer 12-2, a word line WL and an insulation layer 12-3 are formed on a major surface of the semiconductor substrate 11.

Then, on the insulation layer 12-3, CVD, for instance, is carried out to successively deposit a conductor material 31 that becomes an underlying conductive layer 15, a magnetic material 32 that becomes a ferromagnetic layer 16, an insulative material 33 that becomes a insulating barrier layer 17, and a magnetic material 34 that becomes a ferromagnetic layer 18 (this process is not illustrated).

On the magnetic material 34, a protection film is deposited and a photoresist is coated on the protection film (not illustrated).

Figure 66:
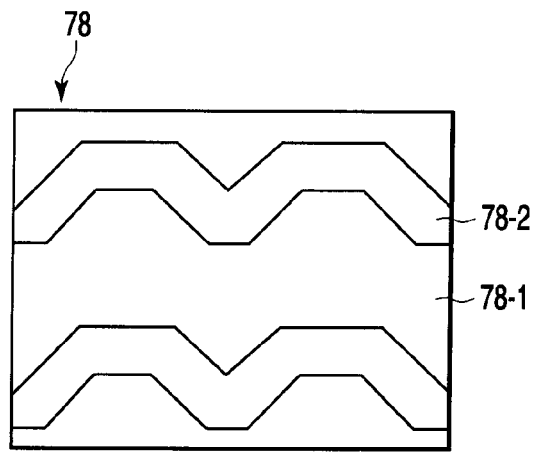
FIG. 66 is a plan view that schematically shows a photomask in a fabrication step of the magnetic memory device according to Modification 6.

Using a photomask (MTJ mask) 78 as shown in FIG. 66, the photoresist is exposed and developed. A pattern 78-2 of the photomask 78 is thus transferred on the photoresist. The photomask 78 has such a pattern 78-2 that deflected regions, which are deflected in the hard-axis direction, are provided on a glass mask 78-1.

Figure 67:
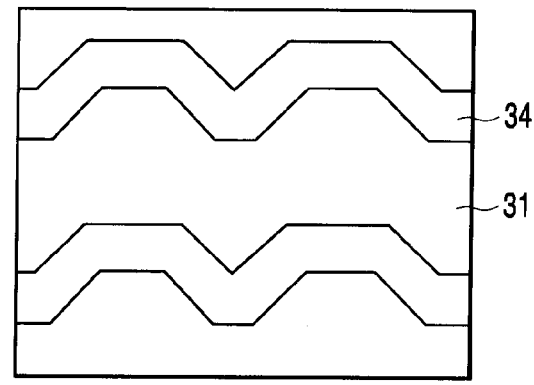
FIG. 67 is a plan view that schematically illustrates a fabrication step of the magnetic memory device according to Modification 6.

As is shown in FIG. 67, using the pattern-transferred photoresist as a mask, anisotropic etching such as RIE is carried out to transfer the pattern 78-2 on the protection film. Further, the photoresist is removed. The protection mask on which the pattern 78-2 is transferred is used as a mask, and anisotropic etching such as RIE is effected down to the surface of the conductive material 31. Thus, the magnetic material 34, insulation material 33 and magnetic material 32 are left in a desired shape.

Subsequently, a protection film is deposited on the magnetic material 34 once again, and a photoresist is further coated on the protection film (not illustrated).

Figure 68:
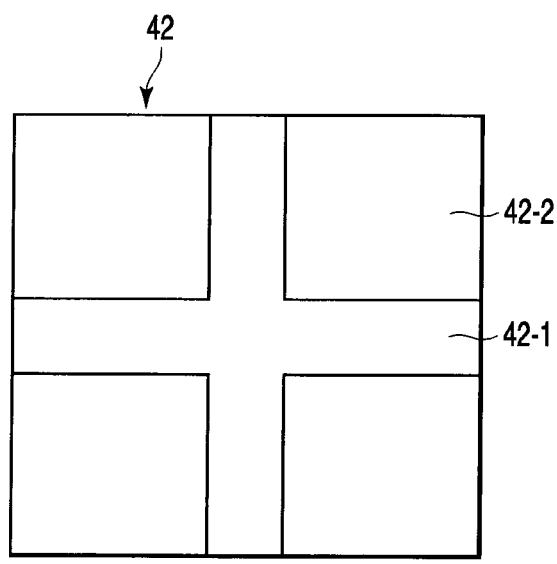
FIG. 68 is a plan view that schematically shows a photomask in a fabrication step of the magnetic memory device according to Modification 6.

Using a photomask (MX mask) 42 as shown in FIG. 68, the photoresist is exposed and developed, and a pattern 42-2 of the photomask 42 is transferred on the photoresist. The photomask 42 is configured such that rectangular patterns 42-2 are provided on a glass mask 42-1.

Figure 69:
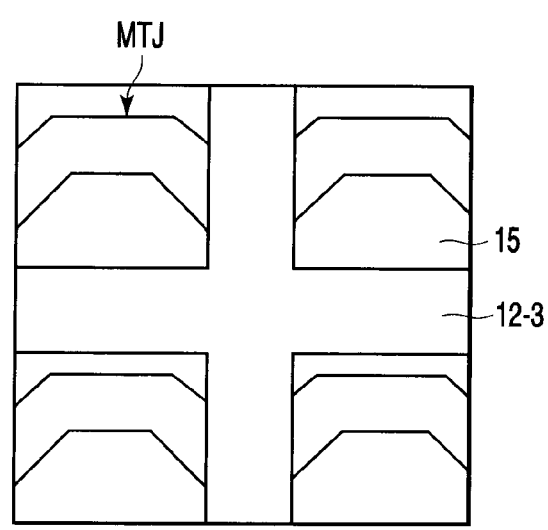
FIG. 69 is a plan view that schematically illustrates a fabrication step of the magnetic memory device according to Modification 6.

Thereafter, as shown in FIG. 69, using the pattern-transferred photoresist as a mask, anisotropic etching such as RIE is carried out to transfer the pattern 42-2 onto the protection film. Further, the photoresist is removed. The protection film, on which the pattern 42-2 is transferred, is used as a mask, and anisotropic etching such as RIE is performed down to the surface of the insulation layer 12-3. Thereby, arm portions of the magnetic layer 32, insulation material 33 and magnetic layer 34 are separated in the easy-axis direction and hard-axis direction, and the MTJ elements are formed. At the same time, the conductive layer 31 is separated in association with the individual MTJ elements, and the underlying conductive layer 15 is formed.

Subsequently, well-known fabrication steps are carried out to form the insulation layer 12-4 and bit line BL, and the MTJ element shown in FIG. 65 is formed. According to the above-described manufacturing method, the same advantages as with the first embodiment can be obtained.

In the second embodiment, Modification 4 and Modification 5, the MTJ element is connected to the drain D of the transistor TR. Alternatively, the MTJ element may be connected to one end of the current path of a diode, one end of the current path of a bipolar transistor, or other wiring layer.

In the first and second embodiments, Modification 4 and Modification 5, the MTJ element has a cruciform plan-view shape. Alternatively, it may have the plan-view shapes shown in FIGS. 11 to 14, or other cross-sectional shapes as illustrated in the Figures.

In the first and second embodiments and Modifications 1 to 6, the MTJ element is described as an example of the magneto-resistance effect element. Alternatively, the invention is also applicable to magnetic memory devices including a GMR (Giant Magneto-Resistance) element, a CMR (Colossal Magneto-Resistance) element, or some other magneto-resistance effect element.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of manufacturing a magnetic memory device, comprising:
    forming a magneto-resistance effect element layer on a first conductive layer;
    patterning the magneto-resistance effect element layer, using a first mask with such a pattern that at least an arm portion in an easy-axis direction extends to an adjacent magnetoresistance effect element; and patterning the magneto-resistance effect element layer and the first conductive layer using a second mask with a matrix pattern, and separating the magneto-resistance effect element layer and the first conductive layer at a time.

2. The method of manufacturing a magnetic memory device, according to claim 1, further comprising:
    forming, prior to said forming the magneto-resistance effect element layer on the first conductive layer, a second conductive layer in a matrix shape, which extends from a formation position of the magneto-resistance effect element layer in a hard-axis direction.

3. The method of manufacturing a magnetic memory device, according to claim 1, wherein the first mask includes a deflected region, which is deflected in a hard-axis direction.

4. A method of manufacturing a magnetic memory device, comprising:
    forming a magneto-resistance effect element layer on a first conductive layer;
    patterning the magneto-resistance effect element layer, using a first mask with such a pattern that arm portions in an easy-axis direction and a hard-axis direction extend to adjacent magneto-resistance effect elements; and
    patterning the magneto-resistance effect element layer and the first conductive layer using a second mask with a matrix pattern, and separating the magneto-resistance effect element layer and the first conductive layer at a time.

5. The method of manufacturing a magnetic memory device, according to claim 4, further comprising:
    forming, prior to said forming the magneto-resistance effect element layer on the first conductive layer, a second conductive layer in a matrix shape, which extends from a formation position of the magneto-resistance effect element layer in the hard-axis direction.

* * * * *